(12) United States Patent
Aharon et al.

(10) Patent No.: US 11,769,988 B2
(45) Date of Patent: Sep. 26, 2023

(54) VERTICAL-CAVITY SURFACE-EMITTING LASER (VCSEL) TUNED THROUGH APPLICATION OF MECHANICAL STRESS VIA A PIEZOELECTRIC MATERIAL

(71) Applicant: Mellanox Technologies, Ltd., Yokneam (IL)

(72) Inventors: Eran Aharon, Mevaseret Zion (IL); Itshak Kalifa, Bat Yam (IL); Elad Mentovich, Tel Aviv (IL); Matan Galanty, Kurzim (IL); Isabelle Cestier, Haifa (IL)

(73) Assignee: MELLANOX TECHNOLOGIES, LTD., Yokneam (IL)

(*) Notice: Subject to any disclaimer, the term of this patent is extended or adjusted under 35 U.S.C. 154(b) by 42 days.

(21) Appl. No.: 16/665,435

(22) Filed: Oct. 28, 2019

(65) Prior Publication Data
US 2021/0126431 A1    Apr. 29, 2021

(51) Int. Cl.
*H01S 5/06* (2006.01)
*H01S 5/183* (2006.01)
(Continued)

(52) U.S. Cl.
CPC ........ *H01S 5/18313* (2013.01); *H01S 5/0261* (2013.01); *H01S 5/0607* (2013.01);
(Continued)

(58) Field of Classification Search
None
See application file for complete search history.

(56) References Cited

U.S. PATENT DOCUMENTS

| 4,935,935 A * | 6/1990 | Reed ............... H01S 5/0607 372/44.01 |
| 5,903,585 A * | 5/1999 | Dawson ............ H01S 5/0612 372/45.01 |

(Continued)

OTHER PUBLICATIONS

Sun Y. et al. *Physics of Strain Effects In Semiconductors and Metal-Oxide-Semiconductor Field-Effect Transistors*, Journal of Applied Physics, vol. 101, No. 10, May 15, 2007, 104503, (22 pages). DOI: 10.1063/1.2730561.

(Continued)

*Primary Examiner* — Tod T Van Roy
(74) *Attorney, Agent, or Firm* — Moore & Van Allen PLLC; R. W. McCord Rayburn

(57) ABSTRACT

A tunable vertical-cavity surface-emitting laser (VCSEL) is provided. The VCSEL includes a VCSEL emission structure, piezoelectric material, and a piezoelectric electrode. The VCSEL emission structure includes a first reflector; a second reflector; and an active cavity material structure disposed between the first and second reflectors. The active cavity material structure includes an active region. The piezoelectric material is mechanically coupled to the VCSEL emission structure such that when the piezoelectric material experiences a mechanical stress, the mechanical stress is transferred to the active cavity material structure of the VCSEL emission structure. The piezoelectric electrode is designed to cause an electric field within the piezoelectric material. The electric field causes the piezoelectric material to experience the mechanical stress, which causes the active cavity material structure to experience the mechanical stress, which causes the emission wavelength of the VCSEL to be modified from a nominal wavelength of the VCSEL.

20 Claims, 7 Drawing Sheets

(51) Int. Cl.
  *H01S 5/40* (2006.01)
  *H01S 5/42* (2006.01)
  *H10N 30/30* (2023.01)
  *H01S 5/026* (2006.01)
(52) U.S. Cl.
  CPC ........ *H01S 5/0614* (2013.01); *H01S 5/18355* (2013.01); *H01S 5/18369* (2013.01); *H01S 5/18394* (2013.01); *H01S 5/4087* (2013.01); *H01S 5/423* (2013.01); *H10N 30/30* (2023.02)

(56) References Cited

U.S. PATENT DOCUMENTS

| | | | |
|---|---|---|---|
| 6,750,071 | B2 | 6/2004 | Chirovsky et al. |
| 9,153,937 | B2* | 10/2015 | Kim ................ B82Y 20/00 |
| 2002/0039376 | A1* | 4/2002 | Kim ................ H01S 5/18388 |
| | | | 372/50.23 |
| 2003/0012249 | A1* | 1/2003 | Eisenbeiser ........ H01S 5/0261 |
| | | | 372/96 |
| 2003/0031221 | A1 | 2/2003 | Wang et al. |
| 2003/0075725 | A1* | 4/2003 | Panajotov ........ H01S 5/02268 |
| | | | 257/99 |
| 2006/0104328 | A1* | 5/2006 | Crews ................ H01S 5/0261 |
| | | | 372/50.124 |
| 2006/0120422 | A1* | 6/2006 | Yamanishi ........ H01S 5/34313 |
| | | | 372/43.01 |
| 2008/0137692 | A1 | 6/2008 | Park et al. |
| 2012/0076166 | A1* | 3/2012 | Schliwa ................ H01L 33/06 |
| | | | 372/45.011 |
| 2018/0188315 | A1* | 7/2018 | Dobrinsky ............ H01L 33/00 |

OTHER PUBLICATIONS

Ostermann, Johannes Michael et al. *Sensitivity of Surface Grating VCSELs to Externally Induced Anisotropic Strain*, Annual Report 2007, Institute of Optoelectronics, Ulm University, pp. 11-16.

Marauska, S. et al. *Sputtered Thin Film Piezoelectric Aluminum Nitride As A Functional MEMS Material and CMOS Compatible Process Integration*, Procedia Engineering vol. 25, pp. 1341-1344, (2011), Athens, Greece.

Paul et al., 10 Gbit/s Direct Modulation of Widely Tunable 1550-nm MEMS VCSEL, *IEEE Journal of Selected Topics in Quantum Electronics*, vol. 21, No. 6, (2015), 10 pages.

* cited by examiner

VERTICAL-CAVITY SURFACE-EMITTING LASER (VCSEL) TUNED THROUGH APPLICATION OF MECHANICAL STRESS VIA A PIEZOELECTRIC MATERIAL

FIELD

Embodiments of the present invention relate generally to vertical-cavity surface-emitting lasers (VCSELs). Example embodiments relate generally to a tunable VCSEL.

BACKGROUND

As data communication demands increase with respect to both volume and speed, fiber optics have become an increasingly popular communication approach. One emerging element of this approach for generating the data stream communicated through fiber optics cables comprises a VCSEL optically coupled with a single mode fiber. However, emitting a single channel along fiber optics cable is insufficient to meet current and growing optical communication demands. Techniques for multiplexing multiple channels into one single mode or multi-mode fiber have been developed, such as wavelength division multiplexing (WDM). For example, an arrayed waveguide grating (AWG) integrated wave guide may be integrated into an optical module for performing WDM. However, multiplexing techniques require sufficient spread between the wavelengths of the signals being multiplexed together to allow for appropriate demultiplexing by the receiver. Traditional monolithic arrays of traditional VCSELs tend to comprise VCSELs that all emit at about the same wavelength. This wavelength is set by the thickness of epitaxial layers that constitute the VCSEL cavity. Some variation of emission wavelength of adjacent devices of an array can be reached by operating the active region of the VCSELs at different temperatures. However, this variation in the wavelength is insufficient to allow for reliable optical communication at sufficient bandwidth to meet the current and growing optical communication bandwidth demand.

BRIEF SUMMARY OF SOME EXAMPLE EMBODIMENTS

Example embodiments of the present invention provide a tunable VCSEL. In various embodiments, the emission wavelength $\lambda'$ of the tunable VCSEL may be tuned up to 100 nm from the nominal wavelength $\lambda$ of the VCSEL. In other embodiments, the tunable difference between the nominal wavelength $\lambda$ of the VCSEL and the emission wavelength $\lambda'$ of the tunable VCSEL may more or less than 100 nm, as appropriate for the application. Example embodiments of the present invention provide multi-beam emission devices comprising an array of VCSELs (e.g., a monolithic VCSEL array) comprising a plurality of tunable VCSELs such that the multi-beam emission device may be operated to emit a set of distinct wavelengths. For example, a multi-beam emission device comprising an array of eight tunable VCSELs (e.g., a monolithic VCSEL array of eight VCSELs) may be provided, and the multi-beam emission device may be operated to emit a set of eight distinct wavelengths, two sets of four distinct wavelengths, and/or the like. Various embodiments of the present invention provide a method for manufacturing a tunable VCSEL. Such tunable VCSELs, host substrate-mounted VCSELs, and multi-beam emitting devices may be used in a variety of applications, such as, for example, fiber optic data transmission in high-speed single mode fiber optic communication systems. In an example embodiment, the host substrate is a host wafer and/or a circuit board, such as a printed circuit board.

In various embodiments, a tunable VCSEL comprises a VCSEL emission structure that is mechanically coupled to piezoelectric material. For example, the VCSEL emission structure may be mechanically coupled to the piezoelectric material such that a mechanical stress experienced by the piezoelectric material is transferred to the VCSEL emission structure. The mechanical stress experienced by the VCSEL emission structure (e.g., the active region of the active cavity material structure of the VCSEL emission structure) causes a change in the band structure of the active region and thereby causes a change in the wavelength emitted by the VCSEL emission structure. For example, the VCSEL emission structure may be configured to have a nominal wavelength $\lambda$. When the mechanical stress experienced by the piezoelectric material is transferred to the VCSEL emission structure, the VCSEL emission structure may emit laser light at an emission wavelength $\lambda'$ that is different from the nominal wavelength $\lambda$. In various embodiments, the piezoelectric material has a piezoelectric electrode deposited on a surface thereof. Application of a voltage to the piezoelectric electrode may cause a controllable electric field to be experienced by the piezoelectric material. The electric field may cause the piezoelectric material to experience a mechanical stress which is transferred to the VCSEL emission structure.

In an example embodiment, a tunable VCSEL of the present invention comprises a VCSEL emission structure, a piezoelectric material, and a piezoelectric electrode deposited on a second surface of the piezoelectric material. In various embodiments, the VCSEL emission structure comprises a first reflector, a second reflector, and an active cavity material structure sandwiched between the first and second reflectors. In various embodiments, the active cavity material structure includes an active region. In various embodiments, an emission aperture is defined such that laser light is emitted through the second reflector and through the emission aperture.

In various embodiments, a piezoelectric material is disposed on and/or embedded within at least a section of the substrate that the VCSEL is disposed on, built on, mounted to, and/or the like. A piezoelectric electrode may be deposited onto a second surface of the piezoelectric material. Application of a voltage to the piezoelectric electrode causes a controllable electric field to be generated in the vicinity of the piezoelectric material, such that the piezoelectric material experiences the electric field. Piezoelectric materials are materials that are deformed (e.g., experience a mechanical stress) in response to experiencing an electric field. Thus, via application of a voltage to the piezoelectric electrode, the piezoelectric material may be deformed (e.g., experience a mechanical stress) in a controlled manner. In various embodiments, the piezoelectric material is mechanically coupled to the VCSEL emission structure such that at least a portion of the mechanical stress experienced by the piezoelectric material is transferred to the VCSEL emission structure. In particular, the piezoelectric material is coupled to the VCSEL emission structure such that, when the piezoelectric material experiences a mechanical stress, due to a voltage being applied to the piezoelectric electrode, the active cavity material structure experiences a mechanical stress that is proportional to the mechanical stress experienced by the piezoelectric material. In various embodiments, the mechanical stress experienced by the active cavity material structure may cause the band structure (e.g., covalence and conduction bands) of the active region to be modified. When the tunable VCSEL emits laser light while the piezoelectric material and the VCSEL emission structure are experiencing a mechanical stress, the modified band structure of the active region results in an emission wavelength $\lambda'$ that is different from the nominal wavelength $\lambda$ of the VCSEL emission structure.

In various embodiments, the tunable VCSEL is also tunable in the sense that the bandwidth of the VCSEL may also be tuned. For example, by applying physical stress to the active region via the mechanical coupling of the piezoelectric material to the VCSEL emission structure, the band structure of various materials and/or layers within the active region may be modified such that the bandwidth of the VCSEL is tuned, modified, and/or adjusted. For example, the modification to the band structure of various materials and/or layers within the active region may change the modulation speed and/or mobility of charge carriers within the band structure, thereby affecting the bandwidth and/or speed at which the VCSEL output may be modified, pulsed, and/or the like.

According to a first aspect of the present invention, a tunable VCSEL is provided. In an example embodiment, the tunable VCSEL includes a VCSEL emission structure, piezoelectric material, and a piezoelectric electrode. The VCSEL emission structure includes a first reflector; a second reflector; and an active cavity material structure disposed between the first and second reflectors. The active cavity material structure includes an active region. The piezoelectric material is mechanically coupled to the VCSEL emission structure such that when the piezoelectric material experiences a mechanical stress, the mechanical stress is transferred to the active cavity material structure of the VCSEL emission structure. The piezoelectric electrode is disposed on a second surface of the piezoelectric material. The piezoelectric electrode is configured to cause an electric field within the piezoelectric material. The electric field causes the piezoelectric material to experience the mechanical stress, which causes the active cavity material structure to experience the mechanical stress, which causes the emission wavelength of the VCSEL to be modified from a nominal wavelength of the VCSEL.

According to another aspect of the present invention, a method for manufacturing a VCSEL is provided. In an example embodiment, the method includes building a VCSEL emission structure. The VCSEL emission structure includes a first reflector; a second reflector; and an active cavity material structure disposed between the first and second reflectors. The active cavity material structure includes an active region. The method further includes growing a piezoelectric material ring about the VCSEL emission structure; and depositing a piezoelectric electrode on a second surface of the piezoelectric material. The piezoelectric electrode is configured to cause an electric field within the piezoelectric material. The piezoelectric material is mechanically coupled to the VCSEL emission structure such that when the piezoelectric material experiences a mechanical stress, the mechanical stress is transferred to the active cavity material structure of the VCSEL emission structure.

According to yet another aspect of the present invention, a method for manufacturing a VCSEL is provided. In an example embodiment, the method includes building a VCSEL emission structure. At least a portion of the VCSEL emission structure is disposed on a piezoelectric material. The VCSEL emission structure includes a first reflector; a second reflector; and an active cavity material structure disposed between the first and second reflectors. The active cavity material structure comprising an active region. The method further includes depositing a piezoelectric electrode on a second surface of the piezoelectric material.

BRIEF DESCRIPTION OF THE DRAWING(S)

Having thus described the invention in general terms, reference will now be made to the accompanying drawings, which are not necessarily drawn to scale, and wherein:

Figure 1:
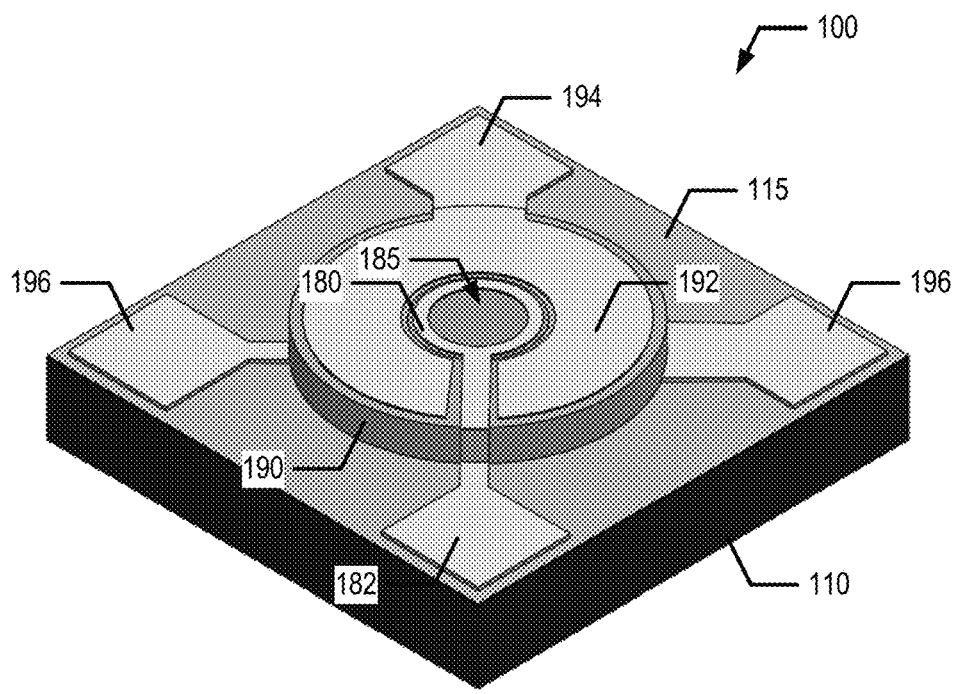
FIG. 1 illustrates an isometric view of a tunable VCSEL, according to an example embodiment.
Figure 4:
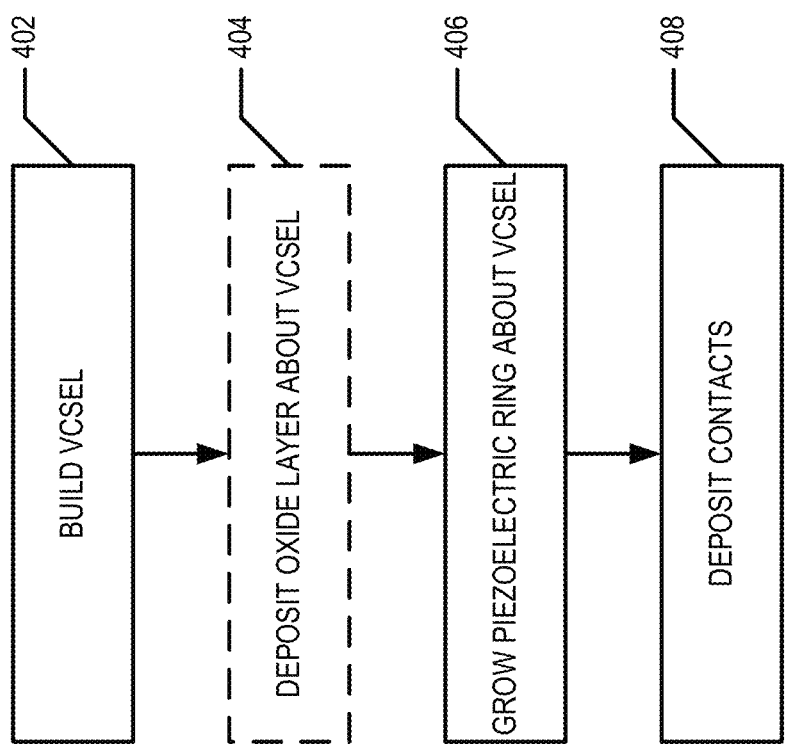
Figure 5:
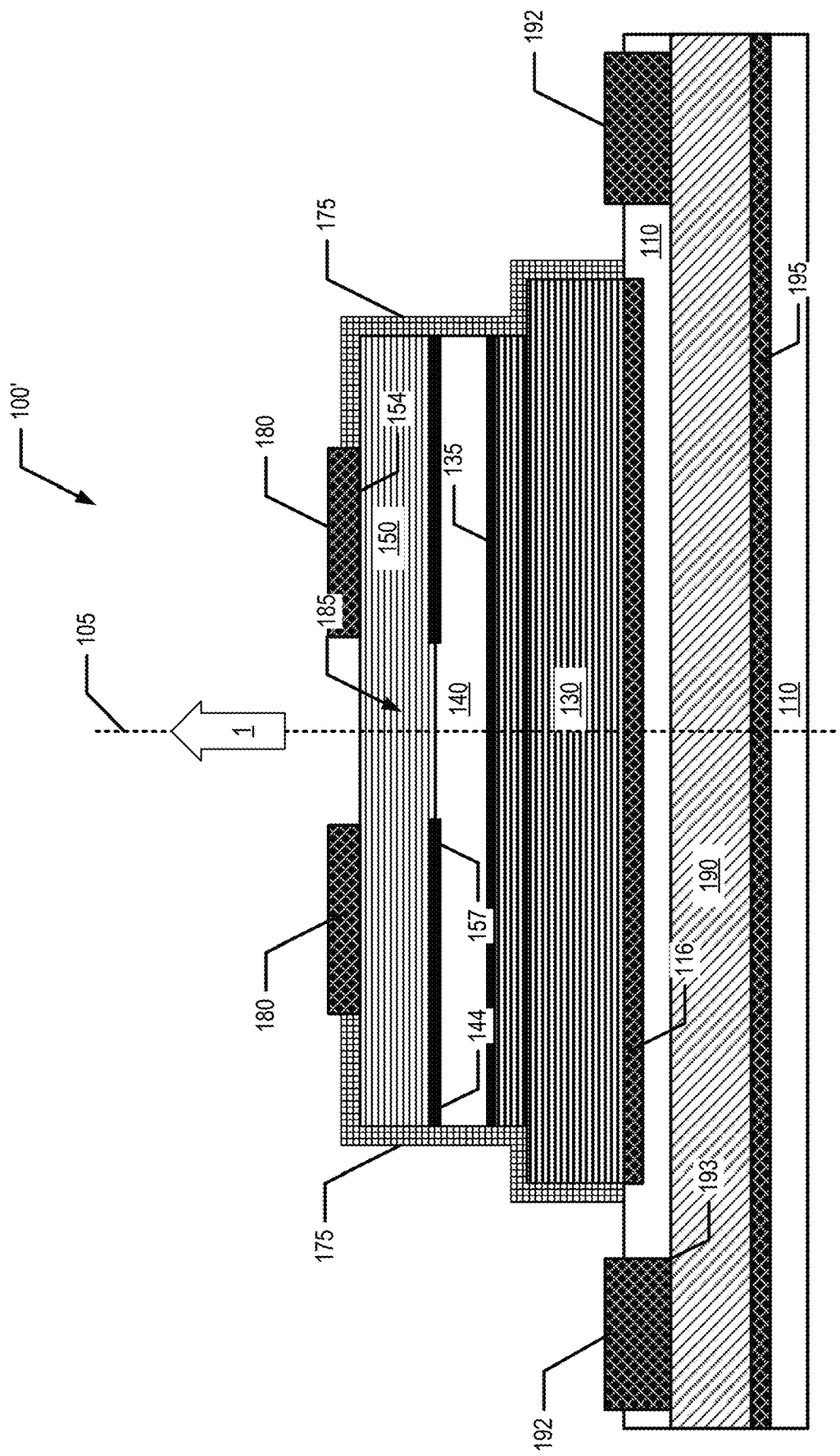
Figure 6:
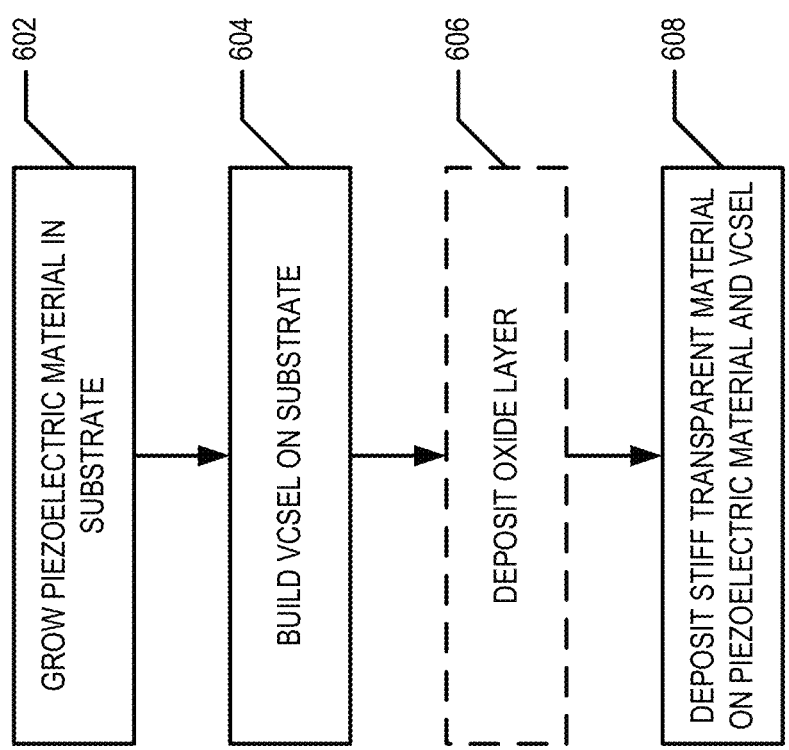
Figure 7:
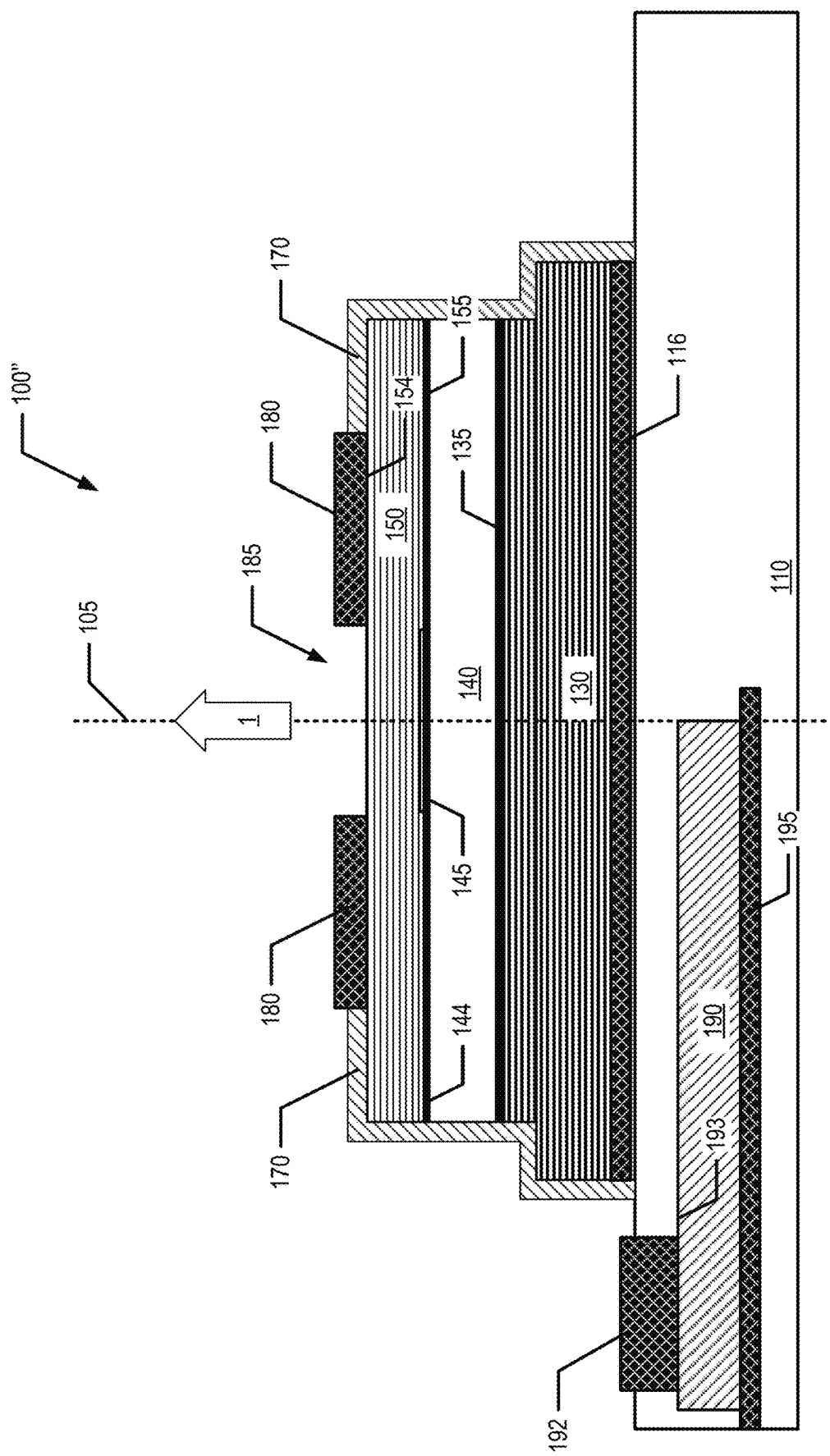
Figure 8:
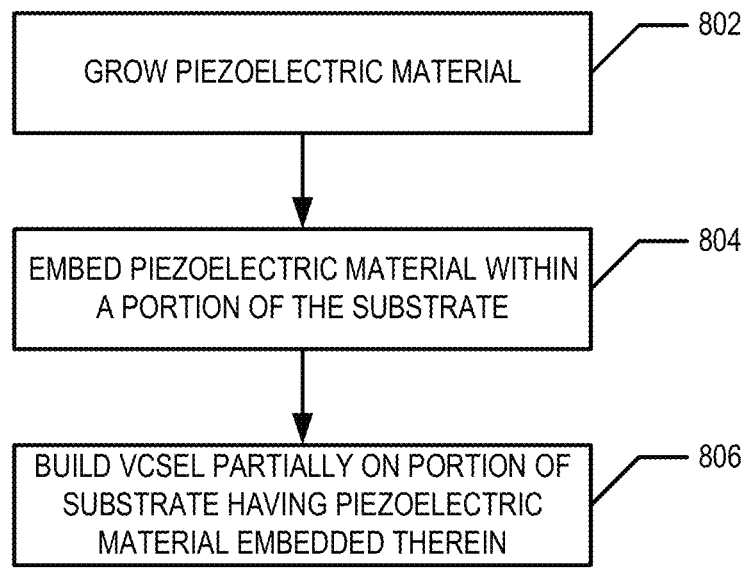
Figure 9:
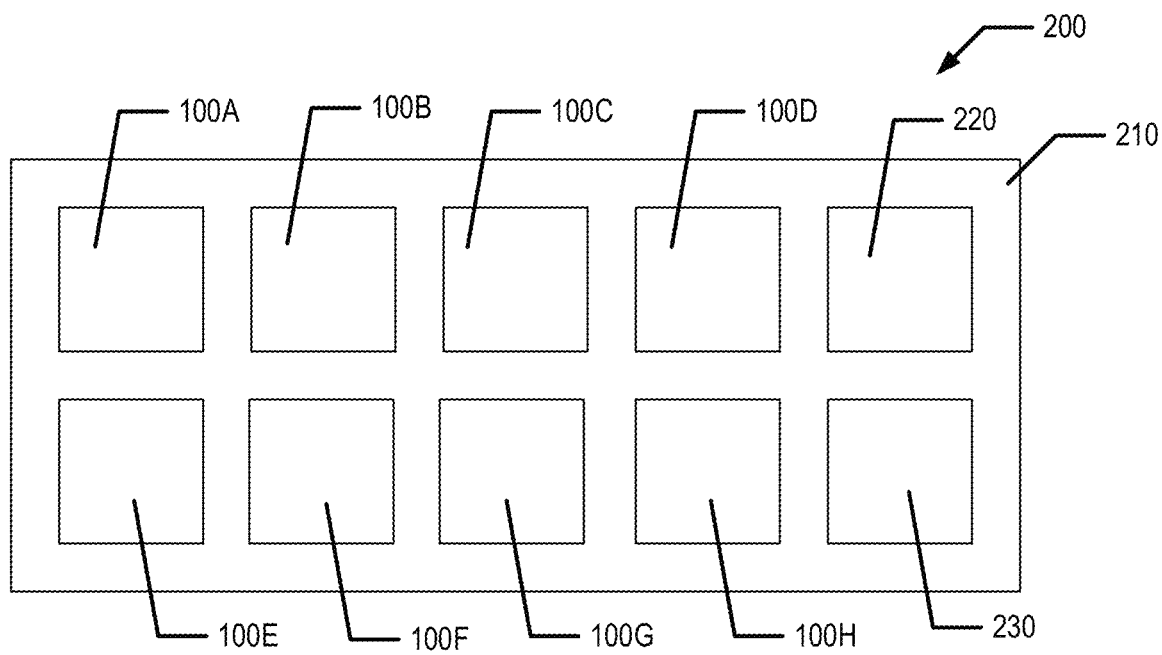

FIG. 4 provides a flowchart illustrating various processes, procedures, and/or operations for manufacturing a tunable VCSEL, such as the tunable VCSEL shown in FIG. 1, according to an example embodiment;

FIG. 5 illustrates a schematic cross-section of a tunable VCSEL, according to another example embodiment;

FIG. 6 provides a flowchart illustrating various processes, procedures, and/or operations for manufacturing a tunable VCSEL, such as the tunable VCSEL shown in FIG. 5, according to an example embodiment;

FIG. 7 illustrates a schematic cross-section of a tunable VCSEL, according to yet another example embodiment;

FIG. 8 provides a flowchart illustrating various processes, procedures, and/or operations for manufacturing a tunable VCSEL, such as the tunable VCSEL shown in FIG. 7, according to an example embodiment; and FIG. 9 provides a schematic diagram of a tunable VCSEL array, according to an example embodiment.

DETAILED DESCRIPTION OF SOME EXAMPLE EMBODIMENTS

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the top or on the bottom, depending on the orientation of the particular item being described. As used herein, the term "approximately" refers to tolerances within manufacturing and/or engineering standards.

Various embodiments provide a tunable VCSEL. In an example embodiment, the tunable VCSEL comprises a piezoelectric material that is mechanically coupled to a VCSEL emission structure. The VCSEL emission structure comprises a first reflector; a second reflector; and an active cavity material structure disposed or sandwiched between the first and second reflectors. In various embodiments, the active cavity material structure comprises an active region configured to generate laser light 1 of a nominal wavelength $\lambda$. In various embodiments, the piezoelectric material is mechanically coupled to the VCSEL emission structure such that at least a portion of mechanical stress experienced by the piezoelectric material (e.g., as a result of an applied electric field) is transferred to the VCSEL emission structure. In particular, when the piezoelectric material experiences a mechanical stress, the active cavity material structure, including the active region, also experiences a mechanical stress. When the active region experiences the mechanical stress, the band structure (e.g., valence band, conduction band, and the band gap therebetween) of the active region is modified such that operation of the tunable VCSEL, as the electric field is being applied to the piezoelectric material, causes laser light 1 of emission wavelength λ' to be emitted. In various embodiments, the emission wavelength λ' is different from the nominal wavelength λ. In various embodiments the difference between the emission wavelength λ' and the nominal wavelength λ (e.g., |λ'−λ|) may be up to approximately 100 nm, depending on the applied electric field.

Various embodiments employ various mechanisms for mechanically coupling the VCSEL emission structure to the piezoelectric material. In an example embodiment, the piezoelectric material is a ring or annular cylinder surrounding the VCSEL emission structure. In an example embodiment, the VCSEL emission structure is built on, disposed on, mounted on, and/or otherwise positioned on the piezoelectric material. For example, the piezoelectric material may be disposed on the substrate and/or at least partially embedded within the substrate upon which the VCSEL emission structure is built. In an example embodiment, a stiff, transparent material is used to increase the mechanical coupling between the VCSEL emission structure and the piezoelectric material.

In an example embodiment, the piezoelectric material may be embedded in a first section of a substrate and the VCSEL emission structure may be disposed and/or built partially on the first section of the substrate and partially on a second section of the substrate, wherein the second section of the substrate is free of piezoelectric material. When an electric field is applied to the piezoelectric material, a non-uniform mechanical stress is experienced by the VCSEL emission structure (e.g., due to the mechanical coupling of the piezoelectric material and the VCSEL emission structure). The non-uniform mechanical stress causes the tunable VCSEL to emit laser light having a particular polarization, in an example embodiment.

In various embodiments, a plurality of tunable VCSELs may be used to create a tunable VCSEL array. In various embodiments, optical signals output by the plurality of tunable VCSELs of the tunable VCSEL array may be multiplexed together using, for example, AWG. In various embodiments, the each tunable VCSEL of the tunable VCSEL array may be in communication with a VCSEL driver (e.g., configured to drive emission of laser light by the VCSEL emission structure) and a deformation voltage source (e.g., configured to apply an electric field to the piezoelectric material). The VCSEL drivers and deformation voltage sources may be configured to operate each tunable VCSEL independently and/or at a particular emission wavelength. For example, each tunable VCSEL of the tunable VCSEL array may be operated so as to emit laser light of a different, unique wavelength, with respect to the other tunable VCSELs of the tunable VCSEL array. In an example embodiment, the laser light emitted by the tunable VCSELs of the tunable VCSEL array may be multiplexed (e.g., via wavelength-division multiplexing and/or another multiplexing technique). The multiplexed signal may then be transmitted via a single-mode or multi-mode optical fiber. The operation of each of the tunable VCSELs of the tunable VCSEL array at different, unique wavelengths provides for more reliable demultiplexing of the multiplexed signal by a receiver of the multiplexed signal.

Various embodiments include a ring or annular cylinder of piezoelectric material, a disc of piezoelectric material, and/or a partial disc of piezoelectric material. Examples of each of these embodiments will now be described. Various embodiments may include a variety of combinations of aspects of the described example embodiments. For example, one example embodiment of a tunable VCSEL comprises a ring or annular cylinder of piezoelectric material, a partial disc of piezoelectric material, and a VCSEL emission structure.

Example Tunable VCSEL with a Ring of Piezoelectric Material

Figure 2:
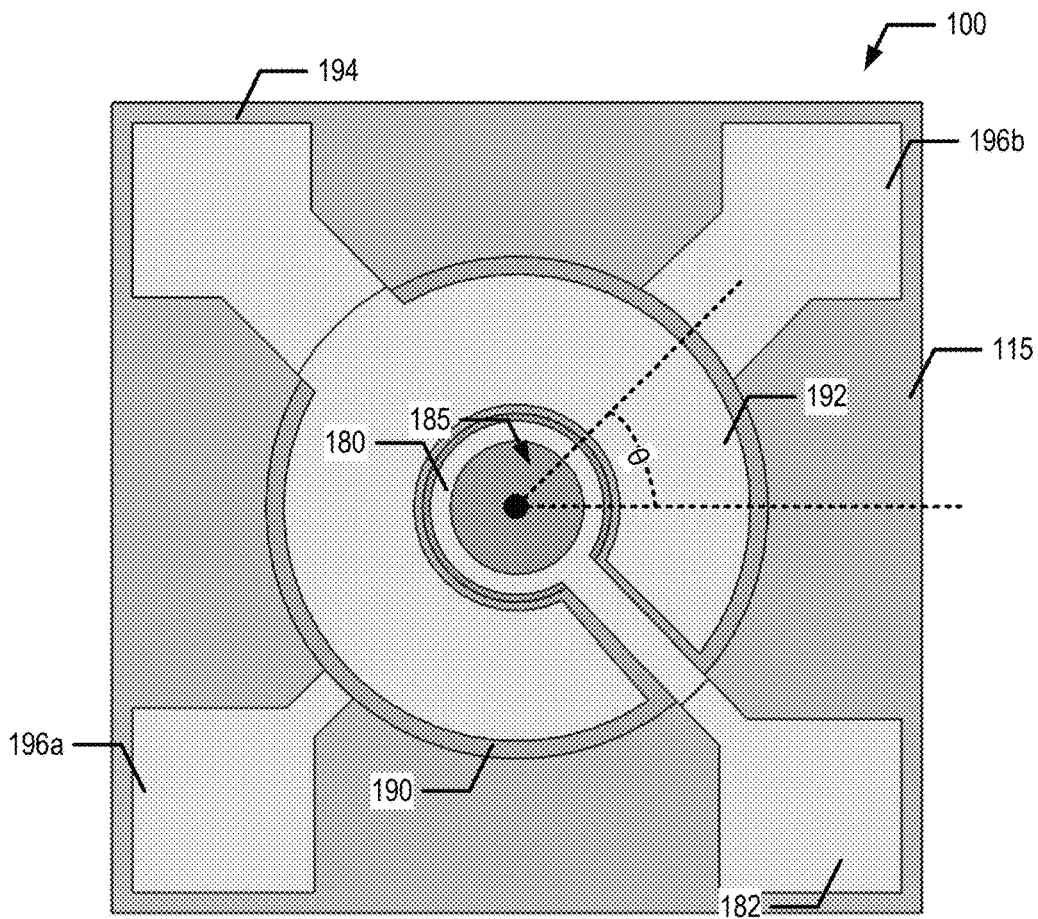
FIG. 2 illustrates a top view of the tunable VCSEL shown in FIG. 1.
Figure 3:
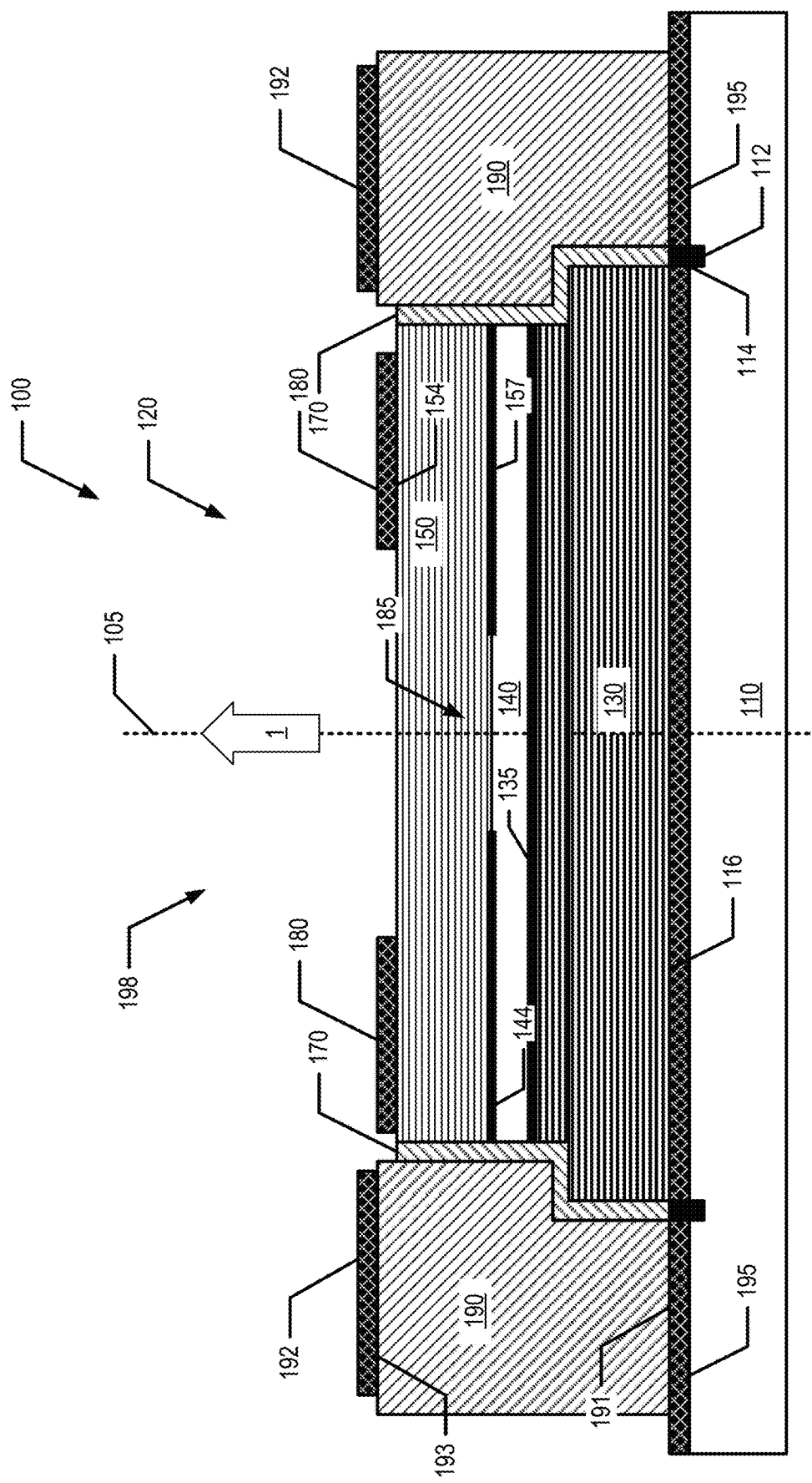
FIG. 3 illustrates a schematic cross-section of the tunable VCSEL shown in FIG. 1.

FIGS. 1, 2, and 3 illustrate various views of an example embodiment of a tunable VCSEL 100. The VCSEL 100, comprises a substrate 110, a VCSEL emission structure 120, a piezoelectric material 190, and a piezoelectric electrode 192. In an example embodiment, a thin oxide layer 115 is deposited and/or disposed between the substrate 110 and the VCSEL emission structure 120 and/or between the substrate and the piezoelectric material 190. In an example embodiment, there is not an oxide layer 115 disposed between the substrate 110 and the VCSEL emission structure 120 and/or between the substrate and the piezoelectric material 190. In an example embodiment, the emission structure comprises a first reflector 130, a second reflector 150, and an active cavity material structure sandwiched between the first and second reflectors 130, 150. In an example embodiment, the first reflector 130 is deposited and/or disposed directly on the substrate 110 and/or the thin oxide layer 115. In an example embodiment, the VCSEL emission structure 120 forms and/or is part of a mesa structure. In an example embodiment, the active cavity material structure comprises a first current-spreading layer 135, an active region 140, and a second current-spreading layer 155. In an example embodiment, the active cavity material structure further comprises a tunnel junction 145 overgrown in the second current-spreading layer 155.

In an example embodiment, the VCSEL 100 further comprises contacts (e.g., comprising trace(s) and/or pad(s) for connecting an electrical source to the VCSEL 100) that are electrically connected to the VCSEL emission structure 120 (e.g., the first and second current-spreading layers 135, 155). For example, the VCSEL 100 comprises a second contact 180 deposited and/or disposed on a second surface 154 of the second reflector 150 and extending away from the emission structure to provide trace(s) and pad(s) for connecting an electrical source to the VCSEL 100. In an example embodiment, the second contact 180 is in electrical communication with the second current-spreading layer 155 and/or the second reflector 150 and a first contact (e.g., disposed adjacent to the mesa structure, in another mesa structure, and/or the like) is in electrical communication with the first current-spreading layer 135 and/or the first reflector 130. For example, the first and second contacts 180 may comprise an anode contact and a cathode contact. In various embodiments, the contacts 180 are configured to have leads secured thereto such that the VCSEL 100 may be operated by applying voltage, current, an electrical signal and/or the like to the VCSEL 100 via the leads (e.g., via driving signal pad 182). In an example embodiment, the second contact 180 is in electrical communication with driving signal pad 182 and the first contact is in electrical communication with a ground pad 196. In various embodiments, the first and second current-spreading layers 135, 155 are configured to provide electrical signals, current, voltage, and/or the like applied to the first and second contacts 180 to the active region 140. In various embodiments, the first and/or second contacts 180 may be made of gold or another conductive material. In an example embodiment, the second contact 180 defines and/or is deposited about an emission aperture 185 through which the VCSEL 100 is configured to emit laser light 1.

In various embodiments, the tunable VCSEL 100 further comprises piezoelectric material 190. In general, a piezoelectric material 190 is a material that provides an electric response to a mechanical stress and/or that experiences a mechanical stress when experiencing an electric field. In an example embodiment, the piezoelectric material 190 is aluminum nitride and/or another piezoelectric material. In an example embodiment, the tunable VCSEL 100 comprises a ring or annular cylinder of piezoelectric material 190 about the VCSEL emission structure 120. For example, the ring or annular cylinder of piezoelectric material 190 may comprise a central opening 198 within which the VCSEL emission structure 120 is disposed. For example, the ring or annular cylinder of piezoelectric material 190 may have a circular, elliptical, rectangular, polygonal, irregular, and/or other annular cross-sectional shape in a cross-section taken in a plane perpendicular to the emission axis 105.

In an example embodiment, an oxide layer 170 is disposed between the ring or annular cylinder of piezoelectric material 190 and the VCSEL emission structure 120. In an example embodiment, the ring or annular cylinder of piezoelectric material 190 is disposed directly about the VCSEL emission structure 120 (e.g., without an intervening oxide layer 170 and/or other intervening layer). In an example embodiment, a first surface 191 of the piezoelectric material 190 ring or annular cylinder is disposed on, abuts, is attached to, and/or is otherwise positioned on the substrate 110, thin oxide layer 115, and/or piezoelectric ground 196. A piezoelectric electrode 192 is deposited, disposed, and/or is otherwise positioned on a second surface 193 of the piezoelectric material 190. In an example embodiment, the oxide layer 170 is in contact with, abuts, and/or is disposed on the second surface 193 of the piezoelectric material 190 and the piezoelectric electrode 192 is deposited, disposed, and/or is otherwise positioned on the second surface 193 of the piezoelectric material 190 so as to sandwich the oxide layer 170. In an example embodiment, the piezoelectric electrode 192 is in electrical communication with the electrode pad 194. In an example embodiment, the electrode pad 194 is configured to have a voltage applied thereto (e.g., by an external voltage source) and the voltage is applied to the piezoelectric electrode 192 such that the piezoelectric material 190 experiences an electric field. In an example embodiment, a ground pad 196 may be configured to ground the piezoelectric material 190 and/or provide a reference point for the voltage applied to the electrode pad 194. For example, a ground pad 196 may be in electrical communication with a ground plate 195, 116 disposed in the vicinity of the piezoelectric material and be configured to be placed in electrical communication with ground.

In an example embodiment, a piezoelectric ground 195 is in electrical communication with a first ground plate 196a and a VCSEL ground 116 is in electrical communication with a second ground plate 196b. In an example embodiment, the piezoelectric ground 195 is electrically isolated with respect to the VCSEL ground 116. For example, trench 112 may be disposed between the piezoelectrical ground 195 and the VCSEL ground 116. In an example embodiment, the trench 112 is at least partially filled with insulating material 114. Electrically isolating the piezoelectric ground 195 and the VCSEL ground 116 may prevent adding noise from the piezoelectric driver (e.g., a high voltage driver) from affecting the VCSEL emission. For various embodiments where the VCSEL is operating at high frequency, the addition of noise from the piezoelectric driver may have a larger affect on the VCSEL emission. In various embodiments for use at lower frequencies, continuous wave (CW) applications, and/or where noise from the piezoelectric driver would not have a detrimental effect on the VCSEL emission, the piezoelectric ground 195 and the VCSEL ground 116 may be combined in to a single common ground. For example, the first and second ground plates 196a and 196b may be electrical communication with one another. In another example of an embodiment having a common ground, the piezoelectric ground 195 and VCSEL ground 116 may be made of a single conductive layer (e.g., the trenches 112 may not be present and the conductive layer may extend across where the trenches 112 are shown in FIG. 3).

In an example embodiment, the substrate 110 provides a base layer upon which the tunable VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In another example embodiment, the substrate 110 is a Si substrate, or another appropriate substrate. In an example embodiment, the substrate 110 may be in the range of 50 to 300 μm thick. For example, the substrate 110 may be approximately 150 μm thick, in an example embodiment. In an example embodiment, the substrate 110 is at least a portion of a wafer, a circuit board (e.g., a printed circuit board), and/or the like.

In various embodiments, the VCSEL emission structure 120 comprises a first reflector 130, a first current-spreading layer 135, an active region 140, and a second reflector 150. In some example embodiments, the VCSEL emission structure 120 comprises a second current spreading layer 155 (see e.g., FIG. 7). In some example embodiments, the VCSEL emission structure 120 comprises an oxide (or other insulative/dielectric) current limiting layer 157 defining an emission aperture 185. The first reflector 130 may be adjacent, secured, mounted to and/or abutting the substrate 110, the thin oxide layer 115, and/or VCSEL ground 116. The first current-spreading layer 135 may be a current spreading layer and/or conductive layer sandwiched between the first reflector 130 and the active region 140. For example, the first current-spreading layer 135 may be adjacent, secured, mounted to and/or abutting the first reflector 130 and the active region 140. The second current-spreading layer 155 may be a current spreading layer and/or conductive layer sandwiched between the active region 140 and the second reflector 150. For example, the second current-spreading layer 155 may be adjacent, secured, mounted to and/or abutting the active region 140 and the second reflector 150. In various embodiments, rather than a second current-spreading layer 155 disposed between the active region 140 and the second reflector 150, an oxide current limiting layer 157 may be sandwiched between the active region 140 and the second reflector 150. For example, the oxide current limiting layer 157 may define the emission aperture 185. In various embodiments, the oxide current limiting layer 157 may be an oxide profile within the second reflector 150.

In various embodiments, the first and second reflectors 130, 150 are configured to couple and/or reflect laser light generated by the active region 140 such that the laser light 1 may be emitted through the aperture of aperture diameter $a_c$ in the contact 180 in a direction along the emission axis 105. In various embodiments, each of the first and second reflectors 130, 150 comprises a semiconductor distributed Bragg reflector (DBR), dielectric reflector stacks, and/or the like. For example, the first and second reflectors 130, 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in some embodiments, each of the first and second reflectors may comprise 25 pairs of layers of GaAs/AlGaAs. For example, each of the first and second reflectors may comprise 25 layers of GaAs and 25 layers of AlGaAs wherein the layers are disposed such that the layers alternate between a GaAs layer and an AlGaAs layer. For example, a pair of layers may consist of a GaAs layer and an abutting AlGaAs layer. In an example embodiment, the thickness of each layer is approximately one-fourth $\lambda/n$, where $\lambda$ is the emission wavelength and n is the refractive index of the semiconductor of that layer. In various embodiments, the first and second reflectors 130, 150 are tunable mirrors/reflectors (e.g., the wavelength at which the reflectors are most effective may be tuned), reflectors that are configured to support broad band cavities (e.g., configured to be effective at reflecting a wide range of wavelengths (e.g., a 25 nm, 50 nm, 100 nm, and/or the like range of wavelengths), and/or otherwise be adaptable to effectively reflect light of emission wavelength $\lambda'$. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR). In an example embodiment, the second reflector 150 is partially oxidized and/or comprises one or more oxidized elements that define an oxidation profile.

As described above, a first current-spreading layer 135 may be sandwiched between the first reflector 130 and the active region 140, and a second current-spreading layer 155 may be sandwiched between the active region 140 and the second reflector 150. In various embodiments, the first and second current-spreading layers 135, 155 comprise n-type indium phosphide (n-InP) layers. In various embodiments, the first and/or second current-spreading layer 135, 155 comprises an indium gallium arsenide phosphide (InGaAsP) layer. In various embodiments, providing the electrical contact through n-type first and second current-spreading layers 135, 155 allows for each of the first and second reflectors 130, 150 to comprise un-doped DBR mirrors or dielectric reflector stacks, as described elsewhere herein.

In various embodiments, the active region 140 comprises a tunnel junction 145 that is embedded and/or disposed within the second current-spreading layer 155 (see e.g., FIG. 7). For example, the tunnel junction 145 may be overgrown by the second current spreading layer 155, wherein the tunnel junction 145 is disposed adjacent and/or abutting the active region 140. In an example embodiment, the tunnel junction 145 is a mesa etched in the $p^{++}/n^{++}$ tunnel junction. In an example embodiment, the tunnel junction 145 comprises a heavily doped p++/n++ indium aluminum gallium arsenide tunnel junction. In various embodiments, a reverse biased p-n junction blocks the current around the tunnel junction 145 when a direct voltage is applied to the VCSEL 100 (e.g., via the contacts 180). In various embodiments, the tunnel junction 145 serves a dual role of optical (photon) and electrical (current) confinement. The tunnel junction 145 may, for example, be embedded in an overgrown region which provides both current and photon confinement. In this example, the current is confined by the reverse p-n junction that is formed at the interface between the second current-spreading layer 155 and a p-layer comprising a second surface 144 of the active region 140. In an example embodiment, optical confinement is defined by the tunnel junction 145 representing an optical aperture for emitting laser light 1 and is determined by the width or diameter of the tunnel junction 145 (e.g., the tunnel junction diameter $D_{TJ}$) in a plane perpendicular to the emission axis 105.

In various embodiments, the active region 140 is sandwiched and/or disposed between the first and second current-spreading layers 135, 155. In various embodiments, the active region 140 is in electrical communication with the first and second current-spreading layers 135, 155. In various embodiments, the active region 140 comprises a plurality of quantum wells, where light and/or electromagnetic radiation 1 is generated, between the first and second reflectors 130, 150. In various embodiments, the active region 140 may comprise a multi-quantum well (MQW) layer stack comprising a series of quantum wells disposed between a series of barriers, a p-type region (layer) disposed between the second current-spreading layer 155 and the MQW layer stack. For example, a second surface 144 of the active region 140 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In an example embodiment, the tunable VCSEL 100 may be operated through the application of a voltage (e.g., a driving signal) via the driving signal pad 182 by a VCSEL driver. The voltage may be electrically communicated from the driving signal pad 182 to the second current spreading layer 155 via the second contact 180. The first current spreading layer 135 may be in electrical communication with a ground pad 196, which in turn is in electrical communication with ground. The voltage may therefore be applied to the active cavity material structure (e.g., the active region 140) such that the band structure (e.g., the conduction band, valence band, and the band gap therebetween) results in the generation of laser light 1 at a nominal wavelength $\lambda$.

During operation of the tunable VCSEL 100, a deformation voltage may be applied to the electrode pad 194. The deformation voltage may then be provided to the piezoelectric electrode 192 (from the electrode pad 194) such that an electric field is established that is experienced by the piezoelectric material 190. As the piezoelectric material 190 experiences the electric field caused by the application of the deformation voltage to the electrode pad 194 (e.g., by a voltage source), the piezoelectric material 190 experiences a mechanical stress. In various embodiments, the proximity of the piezoelectric material 190 to the VCSEL emission structure 120 causes at least a portion of the mechanical stress experienced by the piezoelectric material 190 to be transferred to the VCSEL emission structure 120 such that the VCSEL emission structure 120 experiences a mechanical stress. In an example embodiment, the mechanical stress experienced by the VCSEL emission structure is radial in nature (e.g., directed toward or outward from the emission axis 105). The mechanical stress experienced by the VCSEL emission structure 120, including the active cavity material structure and the active region, in particular, causes the band structure (e.g., valence band, conduction band, and the band gap therebetween) to be modified. In an example embodiment, the mechanical stress experienced by the VCSEL emission structure is uniform (e.g., approximately the same in each radial direction from the emission axis 105). The modified band structure of the tunable VCSEL 100 causes the emission of laser light 1 at an emission wavelength λ' (outward approximately along the emission axis 105) that is different from the nominal wavelength λ of the VCSEL emission structure 120.

In various embodiments, the modified band structure may affect the mobility of charge carriers (e.g., by changing the band gap) such that the mobility of charge carriers within the modified band structure may be greater or less than in the non-modified band structure. The change in the mobility of the charge carriers affects the modulation speed. For example, the modified band structure has a larger bandwidth of modulation than the non-modified band structure in an example embodiment. In an example embodiment, the application of the deformation voltage may be modulated and/or modified during the operation of the tunable VCSEL 100. For example, application of the deformation voltage may be modulated with a periodicity of 1 MHz during the operation of the tunable VCSEL 100, in an example embodiment. As such, the emission wavelength λ' may be fine-tuned throughout the operation of the tunable VCSEL 100. As noted above, the mechanical stress experienced by the VCSEL emission structure 120 due to the mechanical stress experienced by the piezoelectric material 190 may cause the bandwidth of the tunable VCSEL 100 to be modified.

Example Method for Manufacturing a Tunable VCSEL with a Ring of Piezoelectric Material FIG. 4 provides a flowchart illustrating an example process for manufacturing a tunable VCSEL 100 comprising a ring of piezoelectric material according to embodiments described herein. Starting at block 402, a VCSEL emission structure 120 is built on the substrate 110 and/or thin oxide layer 115. For example, a VCSEL blank comprising a plurality of layers may be dry-etched to define one or more mesas (e.g., mesa structure). For example, the VCSEL blank may be formed on the substrate 110 (and/or thin oxide layer 115 and/or conductive VCSEL ground 116) and may comprise a first layer from which a first reflector 130 may be formed, a second layer from which a first current-spreading layer 135 may be formed, a third layer from which an active region 140 may be formed, a fourth layer from which a second current-spreading layer 155 may be formed, a fifth layer from which second reflector 150 may be formed, and/or the like. For example, the first and fifth layers may comprise a plurality of un-doped alternating layers of AlGaAs and GaAs for forming DBR mirrors of the first and second reflectors 130, 150. In an example embodiment, the second and fourth layers comprise a conductive material from which the first and second current-spreading layers 135, 155 may be formed. In an example embodiment, the fourth layer of the VCSEL blank may have a tunnel junction 145 embedded, disposed, and/or grown therein. For example, the third layer may comprise a multi-quantum well (MQW) layer stack comprising a series of quantum wells disposed between a series of barriers. In an example embodiment, the third layer comprises a p-type region (layer) disposed between the MQW layer stack and the fourth layer of the VCSEL blank.

The VCSEL blank may be dry etched to form and/or define one or more mesas (e.g., mesa structure). In an example embodiment, the VCSEL blank is dry etched in Ar—SiCl$_4$ plasma. In an example embodiment, the VCSEL blank is dry etched using a photoresist or dielectric mask. In an example embodiment, the center of the masked region is aligned with the center of the tunnel junction 145. In an example embodiment, the dry etching is used to define the second reflector 150. In an example embodiment, the dry-etching is ceased when the second layer (e.g., the layer from which the first current-spreading layer may be formed) is exposed.

The dry-etched VCSEL blank may be further wet etched to define and/or form the active region 140 and the second reflector 150. For example, in an example embodiment, the wet etching is done by selective chemical etching in H3PO4-H2O2-H2O solutions until the first current-spreading layer 135 is reached. For example, the mesa structure may be wet etched to define and/or to finish defining the VCSEL emission structure 120. For example, at least a portion of the first reflector 130 may have a diameter that is larger than the remainder of the mesa structure and the first current-spreading layer 135 may have a diameter that is approximately the same size as the first reflector 130 or smaller and that is larger than the remainder of the mesa structure. For example, the diameter of the first current-spreading layer 135 may be configured to allow for electrical contacts to be generated between the first current-spreading layer 135 and first contacts configured to provide an electrical signal to the first current-spreading layer 135.

In various embodiments, the surface of the substrate upon which the VCSEL blank is grown, deposited, disposed, and/or the like, may be doped so as to provide a conductive ground layer. For example, a layer of the substrate on the surface of the substrate upon which the VCSEL blank is to be grown, deposited, disposed, and/or the like, may be doped to provide a conductive ground layer. In an example embodiment, the surface of the substrate (e.g., the conductive ground layer) may be etched, trenched, and/or the like to form trenches 112 separating the piezoelectric ground 196 from the VCSEL ground 116. An oxide or other insulator 114 may be deposited, grown, and/or the like within the trenches 112 so as to further electrically isolate the piezoelectric ground 196 from the VCSEL ground 116, in an example embodiment. The VCSEL blank may then be grown, deposited, and/or the like onto the substrate (e.g., the surface of the substrate comprising the conductive ground layer and/or VCSEL ground 116).

At block 404, an oxide layer 170 is deposited on the VCSEL emission structure 120. For example, an oxide layer 170 may be deposited on and/or about the VCSEL emission structure 120 to enclose the VCSEL emission structure 120 and to protect the VCSEL emission structure 120. In an example embodiment, an oxide layer is not deposited on the VCSEL emission structure.

At block 406, a ring or annular cylinder of piezoelectric material is grown around the VCSEL emission structure 120. For example, a ring or annular cylinder of piezoelectric material may be grown on the substrate 110 and/or the thin oxide layer 115 about the VCSEL emission structure 120. In an example embodiment, the piezoelectric material is epitaxially grown.

At block 408, the second contact 180, piezoelectric electrode 192, and/or the like may be deposited and/or formed. For example, various metal deposition techniques may be used to deposit the second contacts 180 and piezoelectric electrode 192. In an example embodiment, the second contacts 180 are deposited around the emission aperture 185. In an example embodiment, the second contacts 180 are deposited and/or formed such that the second contacts 180 are in direct electrical communication with the second current-spreading layer 155. In an example embodiment, the piezoelectric electrode 192 is deposited and/or formed on the second surface 193 of the piezoelectric material 190. In an example embodiment, the piezoelectric electrode 192 is deposited and/or formed on an oxide layer 170 disposed on the second surface 193 of the piezoelectric material 190. In an example embodiment, the second contact 180 is deposited and/or formed such that the second contact 180 is in electrical communication with the driving signal pad 182. In an example embodiment, the piezoelectric electrode 192 is deposited and/or formed such that the piezoelectric electrode 192 is in electrical communication with the electrode pad 194.

As should be understood, once a tunable VCSEL 100 has been formed, manufactured, and/or the like, the VCSEL may be secured, affixed, or otherwise mounted to a circuit board. For example, a VCSEL 100 may be secured, affixed, and/or mounted to a circuit board such that the driving signal pad 182 is in electrical communication with a VCSEL driver, the electrode pad 194 is in electrical communication with a deformation voltage source, and the ground pad(s) 196 are in electrical communication with an electrical ground. Mounting a tunable VCSEL 100 to a circuit board may therefore manufacture, generate, form, and/or otherwise make a board-mounted VCSEL. The board-mounted VCSEL may be a single board-mounted VCSEL or the board-mounted VCSEL may be part of a tunable VCSEL array 200 (e.g., shown in FIG. 9).

Example Tunable VCSEL with a Disc of Piezoelectric Material

FIG. 5 illustrates a schematic cross-section of an example embodiment of a tunable VCSEL 100'. The tunable VCSEL 100', comprises a substrate 110, a VCSEL emission structure 120, a piezoelectric material 190, and a piezoelectric electrode 192. In an example embodiment, a thin oxide layer 115 may be deposited and/or disposed between the substrate 110 and the VCSEL emission structure 120 and/or between the substrate and the piezoelectric material 190. In an example embodiment, the emission structure comprises a first reflector 130, a second reflector 150, and an active cavity material structure sandwiched between the first and second reflectors 130, 150. In an example embodiment, the first reflector 130 is deposited and/or disposed directly on the disc of piezoelectric material 190 and/or an oxide layer 170 disposed and/or deposited on at least a portion of the second surface 193 of the disc of piezoelectric material 190. In an example embodiment, the VCSEL emission structure 120 forms and/or is part of a mesa structure. In an example embodiment, the active cavity material structure an active region 140. In an example embodiment, the active cavity material structure comprises a first current spreading layer 135 and/or a second current-spreading layer 155. In an example embodiment, the active cavity material structure further comprises a tunnel junction 145 overgrown in the second current-spreading layer 155. In an example embodiment, an oxide (or other insulator) current limiting layer 157 is sandwiched between the active cavity material structure (e.g., the active region 140) and the second reflector 150. In an example embodiment, the oxide (or other insulator) current limiting layer 157 defines an emission aperture 185.

In an example embodiment, the tunable VCSEL 100' further comprises contacts (e.g., comprising trace(s) and/or pad(s) for connecting an electrical source to the tunable VCSEL 100') that are electrically connected to the VCSEL emission structure 120 (e.g., the first and second current-spreading layers 135, 155). For example, the tunable VCSEL 100' comprises a second contact 180 disposed on a second surface 154 of the second reflector 150 and extending away from the emission structure to provide trace(s) and pad(s) for connecting an electrical source to the VCSEL 100'. In an example embodiment, the second contact 180 is in electrical communication with the second current-spreading layer 155 and/or second reflector 150 and a first contact (e.g., disposed adjacent to the mesa structure, in another mesa structure, and/or the like) is in electrical communication with the first current-spreading layer 135 and/or the first reflector 130. For example, the first and second contacts 180 may comprise an anode contact and a cathode contact. In various embodiments, the contacts 180 are configured to have leads secured thereto such that the VCSEL 100' may be operated by applying voltage, current, an electrical signal and/or the like to the VCSEL 100' via the leads (e.g., via driving signal pad 182). In an example embodiment, the second contact 180 is in electrical communication with driving signal pad 182 and the first contact is in electrical communication with a ground pad 196. For example, the tunable VCSEL 100' may comprise a VCSEL ground 116 and a piezoelectric ground 196 that may be in electrical communication with the same or different (electrically isolated from one another) grounds pads 196. In various embodiments, the first and second current-spreading layers 135, 155 are configured to provide electrical signals, current, voltage, and/or the like applied to the first and second contacts 180 to the active region 140. In various embodiments, the first and/or second contacts 180 may be made of gold or another conductive material. In an example embodiment, the second contact 180 defines and/or is deposited about an emission aperture 185 through which the VCSEL 100' is configured to emit laser light 1.

In various embodiments, the tunable VCSEL 100' further comprises piezoelectric material 190. As noted above, a piezoelectric material 190 is a material that provides an electric response to a mechanical stress and/or that experiences a mechanical stress when experiencing an electric field. In an example embodiment, the piezoelectric material 190 is aluminum nitride and/or another piezoelectric material. In an example embodiment, the tunable VCSEL 100' comprises a disc of piezoelectric material 190 disposed within the substrate 110. In various embodiments, the disc of piezoelectric material 190 may have a circular, elliptical, rectangular, polygonal, irregular, or other cross-sectional shape in a cross-section taken in a plane perpendicular to the emission axis 105. In an example embodiment, a portion of the substrate 110 is disposed between the piezoelectric material 190 and the VCSEL emission structure 120. A piezoelectric electrode 192 is deposited, disposed, and/or otherwise positioned on a second surface 193 of the piezoelectric material 190. In an example embodiment, the piezoelectric electrode 192 is in electrical communication with the electrode pad 194. In an example embodiment, the electrode pad 194 is configured to have a voltage applied thereto (e.g., by an external voltage source) and the voltage is applied to the piezoelectric electrode 192 such that the piezoelectric material 190 experiences an electric field. In an example embodiment, a ground pad 196 may be configured to ground the piezoelectric material 190 and/or provide a reference point for the voltage applied to the electrode pad 194. For example, a ground pad 196 may be in electrical communication with a ground plate disposed in the vicinity of the piezoelectric material and be configured to be placed in electrical communication with ground.

In an example embodiment, the tunable VCSEL 100' comprises a stiff material 175. In an example embodiment, the stiff material 175 is transparent to wavelengths about the nominal wavelength $\lambda$. For example, the stiff material 175 may transparent to wavelengths in the range of expected emission wavelengths $\lambda'$ (e.g., approximately $\lambda$−100 nm to $\lambda$+100 nm). In various embodiments, the stuff material 175 has a Young's modulus that is sufficiently high that stiff material 175 acts to mechanically couple the piezoelectric material 190 to the VCSEL emission structure 120 such that, when the piezoelectric material 190 experiences a mechanical stress, the stiff material 175 acts to aid in the transference of at least a portion of the mechanical stress to the VCSEL emission structure 120. For example, the stiff material 175 may be Silicon Dioxide in example embodiments of visible and near infrared (NIR) wavelength VCSELs. For example, the stiff material 175 may have a Young's modulus of at least 65 GPa, in an example embodiment. In various embodiments, the stiff material 175 has a Young's modules greater than 65 GPa.

In an example embodiment, the substrate 110 provides a base layer upon which the tunable VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In another example embodiment, the substrate 110 is a Si substrate, or another appropriate substrate. In an example embodiment, the substrate 110 may be in the range of 50 to 300 μm thick. For example, the substrate 110 may be approximately 150 μm thick, in an example embodiment. In an example embodiment, the substrate 110 is at least a portion of a wafer, a circuit board (e.g., a printed circuit board), and/or the like.

In various embodiments, the VCSEL emission structure 120 comprises a first reflector 130, a first current-spreading layer 135, an active region 140, a second current-spreading layer 155, and a second reflector 150. The first reflector 130 may be adjacent, secured, mounted to and/or abutting the substrate 110 and/or the thin oxide layer 115. The first current-spreading layer 135 may be a current spreading layer and/or conductive layer sandwiched between the first reflector 130 and the active region 140. For example, the first current-spreading layer 135 may be adjacent, secured, mounted to and/or abutting the first reflector 130 and the active region 140. The second current-spreading layer 155 may be a current spreading layer and/or conductive layer sandwiched between the active region 140 and the second reflector 150. For example, the second current-spreading layer 155 may be adjacent, secured, mounted to and/or abutting the active region 140 and the second reflector 150. In an example embodiment, rather than a second current-spreading layer 155, an oxide (or other insulator) current limiting layer 157 is sandwiched between the active region 140 and the second reflector 150. In various embodiments, the oxide current limiting layer 157 defines an emission aperture 185 therethrough.

In various embodiments, the first and second reflectors 130, 150 are configured to couple and/or reflect laser light generated by the active region 140 such that the laser light 1 may be emitted through the aperture of aperture diameter $a_c$ in the contact 180 in a direction along the emission axis 105. In various embodiments, each of the first and second reflectors 130, 150 comprises a semiconductor distributed Bragg reflector (DBR), dielectric reflector stacks, and/or the like. For example, the first and second reflectors 130, 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in some embodiments, each of the first and second reflectors may comprise 25 pairs of layers of GaAs/AlGaAs. For example, each of the first and second reflectors may comprise 25 layers of GaAs and 25 layers of AlGaAs wherein the layers are disposed such that the layers alternate between a GaAs layer and an AlGaAs layer. For example, a pair of layers may consist of a GaAs layer and an abutting AlGaAs layer. In an example embodiment, the thickness of each layer is approximately one-fourth $\lambda/n$, where $\lambda$ is the emission wavelength and n is the refractive index of the semiconductor of that layer. In various embodiments, the first and second reflectors 130, 150 are tunable mirrors/reflectors (e.g., the wavelength at which the reflectors are most effective may be tuned), reflectors that are configured to support broad band cavities (e.g., configured to be effective at reflecting a wide range of wavelengths (e.g., a 25 nm, 50 nm, 100 nm, and/or the like range of wavelengths), and/or otherwise be adaptable to effectively reflect light of emission wavelength $\lambda'$. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR). In an example embodiment, the second reflector 150 is partially oxidized and/or comprises one or more oxidized elements that define an oxidation profile.

As described above, a first current-spreading layer 135 may be sandwiched between the first reflector 130 and the active region 140, and a second current-spreading layer 155 may be sandwiched between the active region 140 and the second reflector 150. In various embodiments, the first and second current-spreading layers 135, 155 comprise n-type indium phosphide (n-InP) layers. In various embodiments, the first and/or second current-spreading layer 135, 155 comprises an indium gallium arsenide phosphide (InGaAsP) layer. In various embodiments, providing the electrical contact through n-type first and second current-spreading layers 135, 155 allows for each of the first and second reflectors 130, 150 to comprise un-doped DBR mirrors or dielectric reflector stacks, as described elsewhere herein.

In various embodiments, the active region 140 comprises a tunnel junction 145 that is embedded and/or disposed within the second current-spreading layer 155. For example, the tunnel junction 145 may be overgrown by the second current spreading layer 155, wherein the tunnel junction 145 is disposed adjacent and/or abutting the active region 140. In an example embodiment, the tunnel junction 145 is a mesa etched in the $p^{++}/n^{++}$ tunnel junction. In an example embodiment, the tunnel junction 145 comprises a heavily doped p++/n++ indium aluminum gallium arsenide tunnel junction. In various embodiments, a reverse biased p-n junction blocks the current around the tunnel junction 145 when a direct voltage is applied to the VCSEL 100' (e.g., via the first and second contacts 180). In various embodiments, the tunnel junction 145 serves a dual role of optical (photon) and electrical (current) confinement. The tunnel junction 145 may, for example, be embedded in an overgrown region which provides both current and photon confinement. In this example, the current is confined by the reverse p-n junction that is formed at the interface between the second current-spreading layer 155 and a p-layer comprising a second surface 144 of the active region 140. In an example embodiment, optical confinement is defined by the tunnel junction 145 representing an optical aperture for emitting laser light 1 and is determined by the width or diameter of the tunnel junction 145 (e.g., the tunnel junction diameter $D_{TJ}$) in a plane perpendicular to the emission axis 105. In an example embodiment, the active region 140 does not comprise a tunnel junction 145.

In various embodiments, the active region 140 is sandwiched and/or disposed between the first and second current-spreading layers 135, 155. In various embodiments, the active region 140 is in electrical communication with the first and second current-spreading layers 135, 155. In various embodiments, the active region 140 comprises a plurality of quantum wells, where light and/or electromagnetic radiation 1 is generated, between the first and second reflectors 130, 150. In various embodiments, the active region 140 may comprise a multi-quantum well (MQW) layer stack comprising a series of quantum wells disposed between a series of barriers, a p-type region (layer) disposed between the second current-spreading layer 155 and the MQW layer stack. For example, a second surface 144 of the active region 140 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In an example embodiment, the tunable VCSEL 100' may be operated through the application of a voltage (e.g., a driving signal) via the driving signal pad 182 by a VCSEL driver. The voltage may be electrically communicated from the driving signal pad 182 to the second current spreading layer 155 via the second contact 180. The first current spreading layer 135 may be in electrical communication with a ground pad 196, which in turn is in electrical communication with ground. The voltage may therefore be applied to the active cavity material structure (e.g., the active region 140) such that the band structure (e.g., the conduction band, valence band, and the band gap therebetween) results in the generation of laser light 1 at a nominal wavelength k.

During operation of the tunable VCSEL 100', a deformation voltage may be applied to the electrode pad 194. The deformation voltage may then be provided to the piezoelectric electrode 192 (from the electrode pad 194) such that an electric field is established that is experienced by the piezoelectric material 190. As the piezoelectric material 190 experiences the electric field caused by the application of the deformation voltage to the electrode pad 194 (e.g., by a voltage source), the piezoelectric material 190 experiences a mechanical stress. In various embodiments, the proximity of the piezoelectric material 190 and/or the stiff material 175 (and the coupling of the stiff material 175 to the disc of piezoelectric material 190) to the VCSEL emission structure 120 causes at least a portion of the mechanical stress experienced by the piezoelectric material 190 to be transferred to the VCSEL emission structure 120 such that the VCSEL emission structure 120 experiences a mechanical stress. For example, the stiff material 175 may be mechanically coupled to both the disc of the piezoelectric material 190 and the VCSEL emission structure 120 such that the mechanical stress experienced by the disc of piezoelectric material 190 is transferred, at least in part to the VCSEL emission structure 120 at least in part via the stiff material 175. In an example embodiment, the mechanical stress experienced by the VCSEL emission structure 120 is radial in nature (e.g., directed toward or outward from the emission axis 105). In an example embodiment, the mechanical stress experienced by the VCSEL emission structure is uniform (e.g., approximately the same in each radial direction from the emission axis 105). The mechanical stress experienced by the VCSEL emission structure 120, including the active cavity material structure and the active region, in particular, causes the band structure (e.g., valence band, conduction band, and the band gap therebetween) to be modified. The modified band structure of the tunable VCSEL 100' causes the emission of laser light 1 at an emission wavelength λ' (outward approximately along the emission axis 105) that is different from the nominal wavelength λ of the VCSEL emission structure 120.

In various embodiments, the modified band structure may affect the mobility of charge carriers (e.g., by changing the band gap) such that the mobility of charge carriers within the modified band structure may be greater or less than in the non-modified band structure. The change in the mobility of the charge carriers affects the modulation speed. For example, the modified band structure has a larger bandwidth of modulation than the non-modified band structure in an example embodiment. In an example embodiment, the application of the deformation voltage may be modulated and/or modified during the operation of the tunable VCSEL 100'. For example, application of the deformation voltage may be modulated with a periodicity of 1 MHz during the operation of the tunable VCSEL 100', in an example embodiment. As such, the emission wavelength λ' may be fine-tuned throughout the operation of the tunable VCSEL 100'. As noted above, the mechanical stress experienced by the VCSEL emission structure 120 due to the mechanical stress experienced by the piezoelectric material 190 may cause the bandwidth of the tunable VCSEL 100' to be modified.

Example Method for Manufacturing a Tunable VCSEL with a Disc of Piezoelectric Material FIG. 6 provides a flowchart illustrating an example process for manufacturing a tunable VCSEL 100' comprising a disc of piezoelectric material 190 according to embodiments described herein. Starting at block 602, a disc of piezoelectric material 190 is grown within the substrate 110. In an example embodiment, the disc of piezoelectric material 190 is grown on a surface of a first substrate 110 and then sandwiched between the first substrate and a second substrate to provide a piezoelectric material 190 buried within a substrate 110. In an example embodiment, the piezoelectric material is epitaxially grown. In various embodiments, the substrate 110 (and/or first and second substrates) may comprise doped layers providing a VCSEL ground 116 and a piezoelectric ground 196.

At block 604, a VCSEL emission structure 120 is built on the substrate 110 having the piezoelectric material therein. For example, a VCSEL blank comprising a plurality of layers may be dry-etched to define one or more mesas (e.g., mesa structure). For example, the VCSEL blank may be formed on the disc of piezoelectric material (which is disposed on the substrate 110 and/or thin oxide layer 115) and/or the oxide layer 170 and may comprise a first layer from which a first reflector 130 may be formed, a second layer from which a first current-spreading layer 135 may be formed, a third layer from which an active region 140 may be formed, a fourth layer from which a second current-spreading layer 155 may be formed, a fifth layer from which second reflector 150 may be formed, and/or the like. For example, the first and fifth layers may comprise a plurality of un-doped alternating layers of AlGaAs and GaAs for forming DBR mirrors of the first and second reflectors 130, 150. In an example embodiment, the second and fourth layers comprise a conductive material from which the first and second current-spreading layers 135, 155 may be formed. In an example embodiment, the fourth layer of the VCSEL blank may have a tunnel junction 145 embedded, disposed, and/or grown therein. For example, the third layer may comprise a multi-quantum well (MQW) layer stack comprising a series of quantum wells disposed between a series of barriers. In an example embodiment, the third layer comprises a p-type region (layer) disposed between the MQW layer stack and the fourth layer of the VCSEL blank. In an example embodiment, an oxide (or other insulator) current limiting layer 157 may be deposited on the active region 140 such that the oxide current limiting layer 157 is sandwiched between the active region and the second reflector 150. An aperture may be formed within the oxide current limiting layer 157 to define an emission aperture 185 of the tunable VCSEL 100'.

The VCSEL blank may be dry etched to form and/or define one or more mesas (e.g., mesa structure). In an example embodiment, the VCSEL blank is dry etched in Ar—SiCl$_4$ plasma. In an example embodiment, the VCSEL blank is dry etched using a photoresist or dielectric mask. In an example embodiment, the center of the masked region is aligned with the center of the tunnel junction 145. In an example embodiment, the dry etching is used to define the second reflector 150. In an example embodiment, the dry-etching is ceased when the second layer (e.g., the layer from which the first current-spreading layer may be formed) is exposed.

The dry-etched VCSEL blank may be further wet etched to define and/or form the active region 140 and the second reflector 150. For example, in an example embodiment, the wet etching is done by selective chemical etching in H3PO4-H2O2-H2O solutions until the first current-spreading layer 135 is reached. For example, the mesa structure may be wet etched to define and/or to finish defining the VCSEL emission structure 120. For example, at least a portion of the first reflector 130 may have a diameter that is larger than the remainder of the mesa structure and the first current-spreading layer 135 may have a diameter that is approximately the same size as the first reflector 130 or smaller and that is larger than the remainder of the mesa structure. For example, the diameter of the first current-spreading layer 135 may be configured to allow for electrical contacts to be generated between the first current-spreading layer 135 and first contacts configured to provide an electrical signal to the first current-spreading layer 135.

At block 606, an oxide layer 170 is optionally deposited on the VCSEL emission structure 120. For example, an oxide layer 170 may be deposited on and/or about the VCSEL emission structure 120 to enclose the VCSEL emission structure 120 and to protect the VCSEL emission structure 120.

At block 608, a stiff material 175 may be deposited positioned, and/or secured on the VCSEL emission structure 120. For example, the stiff material 175 may be deposited, positioned, and/or secured onto the VCSEL emission structure 120 such that the stiff material 175 is mechanically coupled to the disc of piezoelectric material 190 and mechanically coupled to the VCSEL emission structure 120.

In various embodiments, the second contact 180, piezoelectric electrode 192, and/or the like may be deposited and/or formed after or before the depositing, positioning, and/or securing of the stiff material 175 onto the VCSEL emission structure 120 and/or disc of piezoelectric material 190. For example, various metal deposition techniques may be used to deposit the second contacts 180 and piezoelectric electrode 192. In an example embodiment, the second contacts 180 are deposited around the emission aperture 185. In an example embodiment, the second contacts 180 are deposited and/or formed such that the second contacts 180 are in direct electrical communication with the second current-spreading layer 155. In an example embodiment, the piezoelectric electrode 192 is deposited and/or formed on the second surface 193 of the piezoelectric material 190. In an example embodiment, the piezoelectric electrode 192 is deposited and/or formed on an oxide layer 170 disposed on the second surface 193 of the piezoelectric material 190. In an example embodiment, the second contact 180 is deposited and/or formed such that the second contact 180 is in electrical communication with the driving signal pad 182. In an example embodiment, the piezoelectric electrode 192 is deposited and/or formed such that the piezoelectric electrode 192 is in electrical communication with the electrode pad 194.

As should be understood, once a tunable VCSEL 100' has been formed, manufactured, and/or the like, the VCSEL may be secured, affixed, or otherwise mounted to a circuit board. For example, a VCSEL 100' may be secured, affixed, and/or mounted to a circuit board such that the driving signal pad 182 is in electrical communication with a VCSEL driver, the electrode pad 194 is in electrical communication with a deformation voltage source, and the ground pad(s) 196 are in electrical communication with an electrical ground. Mounting a tunable VCSEL 100' to a circuit board may therefore manufacture, generate, form, and/or otherwise make a board-mounted VCSEL. The board-mounted VCSEL may be a single board-mounted VCSEL or the board-mounted VCSEL may be part of a tunable VCSEL array 200 (e.g., shown in FIG. 9).

Example Tunable VCSEL with a Partial Disc of Piezoelectric Material

FIG. 7 illustrates a schematic cross-section of an example embodiment of a tunable VCSEL 100". The tunable VCSEL 100", comprises a substrate 110, a VCSEL emission structure 120, a piezoelectric material 190, and a piezoelectric electrode 192. In an example embodiment, a thin oxide layer 115 may be deposited and/or disposed between the substrate 110 and the VCSEL emission structure 120 and/or between the substrate and the piezoelectric material 190. In an example embodiment, the emission structure comprises a first reflector 130, a second reflector 150, and an active cavity material structure sandwiched between the first and second reflectors 130, 150. In an example embodiment, a first portion of the first reflector 130 is deposited and/or disposed in the vicinity of the partial disc of piezoelectric material 190 and a second portion of the first reflector is deposited directly over a portion of the substrate 110 not having piezoelectric material 190 embedded therein. For example, a first section of the substrate 110 may have a partial disc of piezoelectric material 190 embedded therein and a second section of the substrate 110 may be free of piezoelectric material. In an example embodiment, a thin oxide layer 115 (or oxide layer 170) may be disposed and/or deposited on both the first and second sections of the substrate 110. In an example embodiment, a first portion of the VCSEL emission structure 120 is disposed on the first section of the substrate 110 (e.g., the section and/or portion of the substrate 110 having the piezoelectric material embedded therein) and a second portion of the VCSEL emission structure 120 is disposed on the second section of the substrate 110 (e.g., a section and/or portion of the substrate 110 which is free of piezoelectric material 190). In an example embodiment, the VCSEL emission structure 120 forms and/or is part of a mesa structure. In an example embodiment, the active cavity material structure comprises a first current-spreading layer 135, an active region 140, and a second current-spreading layer 155. In an example embodiment, the active cavity material structure further comprises a tunnel junction 145 overgrown in the second current-spreading layer 155. In an example embodiment, the VCSEL emission structure 120 does not include a second current-spreading layer 155 and/or tunnel junction 145. In an example embodiment, the VCSEL emission structure 120 comprises an oxide (or other insulator) current limiting layer 157 having an aperture defined therein. The aperture defined within the oxide current limiting layer 157 defines the emission aperture 185 of the tunable VCSEL 100".

In an example embodiment, the VCSEL 100" further comprises contacts (e.g., comprising trace(s) and/or pad(s) for connecting an electrical source to the VCSEL 100") that are electrically connected to the VCSEL emission structure 120 (e.g., the first and second current-spreading layers 135, 155). For example, the VCSEL 100" comprises a second contact 180 disposed adjacent to, mounted to, secured to, and/or abutting an oxide layer 170 disposed on a second surface 154 of the second reflector 150 and extending away from the emission structure to provide trace(s) and pad(s) for connecting an electrical source to the VCSEL 100". In an example embodiment, the second contact 180 is in electrical communication with the second current-spreading layer 155 and a first contact (e.g., disposed adjacent to the mesa structure, in another mesa structure, and/or the like) is in electrical communication with the first current-spreading layer 135. For example, the first and second contacts 180 may comprise an anode contact and a cathode contact. In various embodiments, the contacts 180 are configured to have leads secured thereto such that the VCSEL 100" may be operated by applying voltage, current, an electrical signal and/or the like to the VCSEL 100" via the leads (e.g., via driving signal pad 182). In an example embodiment, the second contact 180 is in electrical communication with driving signal pad 182 and the first contact is in electrical communication with a ground pad 196. In various embodiments, the first and second current-spreading layers 135, 155 are configured to provide electrical signals, current, voltage, and/or the like applied to the first and second contacts 180 to the active region 140. In various embodiments, the first and/or second contacts 180 may be made of gold or another conductive material. In an example embodiment, the second contact 180 defines and/or is deposited about an emission aperture 185 through which the VCSEL 100" is configured to emit laser light 1.

In various embodiments, the tunable VCSEL 100" further comprises piezoelectric material 190. As described elsewhere herein, a piezoelectric material 190 is a material that provides an electric response to a mechanical stress and/or that experiences a mechanical stress when experiencing an electric field. In an example embodiment, the piezoelectric material 190 is aluminum nitride and/or another piezoelectric material. In an example embodiment, the tunable VCSEL 100" comprises a partial disc of piezoelectric material 190 disposed between the substrate 110 and the VCSEL emission structure 120. In an example embodiment, the partial disc of piezoelectric material 190 is embedded and/or partially embedded within the first section of the substrate 110. In various embodiments, the partial disc of piezoelectric material may have a semi-circular, semi-elliptical, rectangular, polygonal, irregular, or other cross-sectional shape in a cross-section taken in a plane perpendicular to the emission axis 105. In an example embodiment, an oxide layer 170 is disposed between the partial disc of piezoelectric material 190 and the first portion of the VCSEL emission structure 120. In an example embodiment, a first surface 191 of the piezoelectric material 190 disc is disposed on, abuts, is attached to, embedded within and/or otherwise positioned on and/or in the substrate 110. A piezoelectric electrode 192 is deposited, disposed, and/or otherwise positioned on a second surface 193 of the piezoelectric material 190. In an example embodiment, the oxide layer 170 is in contact with, abuts, and/or is disposed on the second surface 193 of the piezoelectric material 190 and the piezoelectric electrode 192 is deposited, disposed, and/or otherwise positioned on the second surface 193 of the piezoelectric material 190 so as to sandwich the oxide layer 170 therebetween. In an example embodiment, the piezoelectric electrode 192 is in electrical communication with the electrode pad 194. In an example embodiment, the electrode pad 194 is configured to have a voltage applied thereto (e.g., by an external voltage source) and the voltage is applied to the piezoelectric electrode 192 such that the piezoelectric material 190 experiences an electric field. In an example embodiment, a ground pad 196 may be configured to ground the piezoelectric material 190 and/or provide a reference point for the voltage applied to the electrode pad 194. For example, a ground pad 196 may be in electrical communication with a piezoelectric ground 195 disposed in the vicinity of the piezoelectric material 190 (e.g., in electrical communication with the piezoelectric material) and be configured to be placed in electrical communication with ground. In an example embodiment, a same or different ground pad 196 may be in electrical communication with VCSEL ground 116. In an example embodiment, the piezoelectric ground 195 is electrically isolated from the VCSEL ground 116. In an example embodiment, the piezoelectric ground 195 is in electrical communication with the VCSEL ground 116.

In an example embodiment, the substrate 110 provides a base layer upon which the tunable VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In another example embodiment, the substrate 110 is a Si substrate, or another appropriate substrate. In an example embodiment, the substrate 110 may be in the range of 50 to 300 μm thick. For example, the substrate 110 may be approximately 150 μm thick, in an example embodiment. In an example embodiment, the substrate 110 is at least a portion of a wafer, a circuit board (e.g., a printed circuit board), and/or the like. In an example embodiment, the partial disc of piezoelectric material 190 is embedded within a first section of the substrate 110 and the remaining substrate 110 (referred to as the second section of the substrate 110 herein) is free of piezoelectric material.

In various embodiments, the VCSEL emission structure 120 comprises a first reflector 130, a first current-spreading layer 135, an active region 140, a second current-spreading layer 155, and a second reflector 150. The first reflector 130 may be adjacent, secured, mounted to and/or abutting the substrate 110 and/or the thin oxide layer 115. The first current-spreading layer 135 may be a current spreading layer and/or conductive layer sandwiched between the first reflector 130 and the active region 140. For example, the first current-spreading layer 135 may be adjacent, secured, mounted to and/or abutting the first reflector 130 and the active region 140. The second current-spreading layer 155 may be a current spreading layer and/or conductive layer sandwiched between the active region 140 and the second reflector 150. For example, the second current-spreading layer 155 may be adjacent, secured, mounted to and/or abutting the active region 140 and the second reflector 150.

In various embodiments, the first and second reflectors 130, 150 are configured to couple and/or reflect laser light generated by the active region 140 such that the laser light 1 may be emitted through the aperture of aperture diameter $a_c$ in the contact 180 in a direction along the emission axis 105. In various embodiments, each of the first and second reflectors 130, 150 comprises a semiconductor distributed Bragg reflector (DBR), dielectric reflector stacks, and/or the like. For example, the first and second reflectors 130, 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in some embodiments, each of the first and second reflectors may comprise 25 pairs of layers of GaAs/AlGaAs. For example, each of the first and second reflectors may comprise 25 layers of GaAs and 25 layers of AlGaAs wherein the layers are disposed such that the layers alternate between a GaAs layer and an AlGaAs layer. For example, a pair of layers may consist of a GaAs layer and an abutting AlGaAs layer. In an example embodiment, the thickness of each layer is approximately one-fourth $\lambda/n$, where $\lambda$ is the emission wavelength and n is the refractive index of the semiconductor of that layer. In various embodiments, the first and second reflectors 130, 150 are tunable mirrors/reflectors (e.g., the wavelength at which the reflectors are most effective may be tuned), reflectors that are configured to support broad band cavities (e.g., configured to be effective at reflecting a wide range of wavelengths (e.g., a 25 nm, 50 nm, 100 nm, and/or the like range of wavelengths), and/or otherwise be adaptable to effectively reflect light of emission wavelength $\lambda'$. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR). In an example embodiment, the second reflector 150 is partially oxidized and/or comprises one or more oxidized elements that define an oxidation profile.

As described above, a first current-spreading layer 135 may be sandwiched between the first reflector 130 and the active region 140, and a second current-spreading layer 155 may be sandwiched between the active region 140 and the second reflector 150. In various embodiments, the first and second current-spreading layers 135, 155 comprise n-type indium phosphide (n-InP) layers. In various embodiments, the first and/or second current-spreading layer 135, 155 comprises an indium gallium arsenide phosphide (InGaAsP) layer. In various embodiments, providing the electrical contact through n-type first and second current-spreading layers 135, 155 allows for each of the first and second reflectors 130, 150 to comprise un-doped DBR mirrors or dielectric reflector stacks, as described elsewhere herein.

In various embodiments, the active region 140 comprises a tunnel junction 145 that is embedded and/or disposed within the second current-spreading layer 155. For example, the tunnel junction 145 may be overgrown by the second current spreading layer 155, wherein the tunnel junction 145 is disposed adjacent and/or abutting the active region 140. In an example embodiment, the tunnel junction 145 is a mesa etched in the $p^{++}/n^{++}$ tunnel junction. In an example embodiment, the tunnel junction 145 comprises a heavily doped p++/n++ indium aluminum gallium arsenide tunnel junction. In various embodiments, a reverse biased p-n junction blocks the current around the tunnel junction 145 when a direct voltage is applied to the VCSEL 100" (e.g., via the first and second contacts 180). In various embodiments, the tunnel junction 145 serves a dual role of optical (photon) and electrical (current) confinement. The tunnel junction 145 may, for example, be embedded in an overgrown region which provides both current and photon confinement. In this example, the current is confined by the reverse p-n junction that is formed at the interface between the second current-spreading layer 155 and a p-layer comprising a second surface 144 of the active region 140. In an example embodiment, optical confinement is defined by the tunnel junction 145 representing an optical aperture for emitting laser light 1 and is determined by the width or diameter of the tunnel junction 145 (e.g., the tunnel junction diameter $D_{TJ}$) in a plane perpendicular to the emission axis 105.

In various embodiments, the active region 140 is sandwiched and/or disposed between the first and second current-spreading layers 135, 155. In various embodiments, the active region 140 is in electrical communication with the first and second current-spreading layers 135, 155. In various embodiments, the active region 140 comprises a plurality of quantum wells, where light and/or electromagnetic radiation 1 is generated, between the first and second reflectors 130, 150. In various embodiments, the active region 140 may comprise a multi-quantum well (MQW) layer stack comprising a series of quantum wells disposed between a series of barriers, a p-type region (layer) disposed between the second current-spreading layer 155 and the MQW layer stack. For example, a second surface 144 of the active region 140 may comprise a p-type layer. In an example embodiment, the series of quantum wells and barriers may comprise six un-doped compressively strained, indium aluminum gallium arsenide (InAlGaAs) quantum wells and seven tensile strained InAlGaAs barriers.

In an example embodiment, the tunable VCSEL 100" may be operated through the application of a voltage (e.g., a driving signal) via the driving signal pad 182 by a VCSEL driver. The voltage may be electrically communicated from the driving signal pad 182 to the second current spreading layer 155 via the second contact 180. The first current spreading layer 135 may be in electrical communication with a ground pad 196, which in turn is in electrical communication with ground. The voltage may therefore be applied to the active cavity material structure (e.g., the active region 140) such that the band structure (e.g., the conduction band, valence band, and the band gap therebetween) results in the generation of laser light 1 at a nominal wavelength $\lambda$.

During operation of the tunable VC SEL 100", a deformation voltage may be applied to the electrode pad 194. The deformation voltage may then be provided to the piezoelectric electrode 192 (from the electrode pad 194) such that an electric field is established that is experienced by the piezoelectric material 190. As the piezoelectric material 190 experiences the electric field caused by the application of the deformation voltage to the electrode pad 194 (e.g., by a voltage source), the piezoelectric material 190 experiences a mechanical stress. In various embodiments, the proximity of the piezoelectric material 190 to the VCSEL emission structure 120 causes at least a portion of the mechanical stress experienced by the piezoelectric material 190 to be transferred to the VCSEL emission structure 120 such that the VCSEL emission structure 120 experiences a mechanical stress. For example, the deformation of the partial disc of the piezoelectric material 190 due to the mechanical stress experienced by the partial disc of piezoelectric material 190 the VCSEL emission structure 120 may experience a directional (e.g., non-uniform) mechanical stress. For example, as the first portion of the VCSEL emission structure 120 is disposed on the first section of the substrate 110 that comprises the partial disc of piezoelectric material 190 and the second portion of the VCSEL emission structure 120 is disposed on the second section of the substrate that is free of piezoelectric material, the first and second portions of the VCSEL emission structure 120 experience different mechanical stresses. In an example embodiment, the mechanical stress experienced by the VCSEL emission structure 120 is radial in nature (e.g., directed toward or outward from the emission axis 105). In an example embodiment, the mechanical stress experienced by the VCSEL emission structure is non-uniform (e.g., changes as the angle θ about the emission axis 105 changes, as shown in FIG. 2). The mechanical stress experienced by the VCSEL emission structure 120, including the active cavity material structure and the active region, in particular, causes the band structure (e.g., valence band, conduction band, and the band gap therebetween) to be modified. The modified band structure of the tunable VCSEL 100″ causes the emission of laser light 1 at an emission wavelength λ' that is different from the nominal wavelength λ of the VCSEL emission structure 120.

In various embodiments, the modified band structure may affect the mobility of charge carriers (e.g., by changing the band gap) such that the mobility of charge carriers within the modified band structure may be greater or less than in the non-modified band structure. The change in the mobility of the charge carriers affects the modulation speed. For example, the modified band structure has a larger bandwidth of modulation than the non-modified band structure in an example embodiment. In an example embodiment, the application of the deformation voltage may be modulated and/or modified during the operation of the tunable VCSEL 100″. For example, application of the deformation voltage may be modulated with a periodicity of 1 MHz during the operation of the tunable VCSEL 100″, in an example embodiment. As such, the emission wavelength λ' (outward approximately along the emission axis 105) may be fine-tuned throughout the operation of the tunable VCSEL 100″.

In various embodiments, the non-uniformity of the mechanical stress experienced by the VCSEL emission structure 120 (e.g., the active region 140) causes the band structure of the active region 140 to be modified in a directional and/or non-uniform manner. For example, the mobility of charge carriers may be increased in a first direction along the lattice of the active region material. In another example, the mobility of the charge carriers may be modified in a first direction along the lattice of the active region material in a different manner than in a second, orthogonal direction along the lattice of the active region material. This directional modification of the band structure of the active region 140 may cause a particular polarization of laser light 1 to be emitted by the VCSEL emission structure. Thus, the application of an electric field to the partial disc of piezoelectric material 190 may be used to select a particular polarization for the emitted laser light 1. As noted above, the mechanical stress experienced by the VCSEL emission structure 120 due to the mechanical stress experienced by the piezoelectric material 190 may cause the bandwidth of the tunable VCSEL 100′ to be modified.

Example Method for Manufacturing a Tunable VCSEL with a Partial Disc of Piezoelectric Material FIG. 8 provides a flowchart illustrating an example process for manufacturing a tunable VCSEL 100″ comprising a partial disc of piezoelectric material 190 according to embodiments described herein. Starting at block 802, a partial disc of piezoelectric material 190 is grown. In an example embodiment, the piezoelectric material is epitaxially grown.

At block 804, the partial disc of piezoelectric material 190 is embedded in a first section of the substrate 110. For example, the first section of the substrate 110 may be hollowed, beveled, excavated, and/or the like to prepare a seat for receiving the partial disc of piezoelectric material 190 such that the partial disc of piezoelectric material may be embedded into the first section of the substrate 110. The partial disc of piezoelectric material 190 may then be secured into the seat such that the partial disc of piezoelectric material is embedded within the first section of the substrate 110. In an example embodiment, a second layer of substrate 110 is secured to the second surface of the piezoelectric material 193 and the second surface of the second section of the substrate.

At block 806, a VCSEL emission structure 120 is built on the first and second sections of the substrate 110. For example, the VCSEL emission structure 120 is built on the substrate 110 such that a first portion of the VCSEL emission structure 120 is disposed on the first section of the substrate 110 having the partial disc of piezoelectric material 190 embedded therein and a second section of the VCSEL emission structure 120 is disposed on the second section of the substrate 110 that is free of piezoelectric material. In an example embodiment, an oxide layer 170 is deposited on the second surface 193 of the partial disc of piezoelectric material 190 and/or the substrate 110 (e.g., the second section of the substrate 110) and the VCSEL emission structure 120 is built on the oxide layer 170. For example, a VCSEL blank comprising a plurality of layers may be dry-etched to define one or more mesas (e.g., mesa structure). For example, the VCSEL blank may be formed partially on the partial disc of piezoelectric material (which is embedded within the first section of the substrate 110 and/or the oxide layer 170 and partially on the second section of the substrate 110 (which is free of piezoelectric material) and may comprise a first layer from which a first reflector 130 may be formed, a second layer from which a first current-spreading layer 135 may be formed, a third layer from which an active region 140 may be formed, a fourth layer from which a second current-spreading layer 155 may be formed, a fifth layer from which second reflector 150 may be formed, and/or the like. For example, the first and fifth layers may comprise a plurality of un-doped alternating layers of AlGaAs and GaAs for forming DBR mirrors of the first and second reflectors 130, 150. In an example embodiment, the second and fourth layers comprise a conductive material from which the first and second current-spreading layers 135, 155 may be formed. In an example embodiment, the fourth layer of the VCSEL blank may have a tunnel junction 145 embedded, disposed, and/or grown therein. For example, the third layer may comprise a multi-quantum well (MQW) layer stack comprising a series of quantum wells disposed between a series of barriers. In an example embodiment, the third layer comprises a p-type region (layer) disposed between the MQW layer stack and the fourth layer of the VCSEL blank.

The VCSEL blank may be dry etched to form and/or define one or more mesas (e.g., mesa structure). In an example embodiment, the VCSEL blank is dry etched in Ar—SiCl$_4$ plasma. In an example embodiment, the VCSEL blank is dry etched using a photoresist or dielectric mask. In an example embodiment, the center of the masked region is aligned with the center of the tunnel junction 145. In an example embodiment, the dry etching is used to define the second reflector 150. In an example embodiment, the dry-etching is ceased when the second layer (e.g., the layer from which the first current-spreading layer may be formed) is exposed.

The dry-etched VCSEL blank may be further wet etched to define and/or form the active region 140 and the second reflector 150. For example, in an example embodiment, the wet etching is done by selective chemical etching in H3PO4-H2O2-H2O solutions until the first current-spreading layer 135 is reached. For example, the mesa structure may be wet etched to define and/or to finish defining the VCSEL emission structure 120. For example, at least a portion of the first reflector 130 may have a diameter that is larger than the remainder of the mesa structure and the first current-spreading layer 135 may have a diameter that is approximately the same size as the first reflector 130 or smaller and that is larger than the remainder of the mesa structure. For example, the diameter of the first current-spreading layer 135 may be configured to allow for electrical contacts to be generated between the first current-spreading layer 135 and first contacts configured to provide an electrical signal to the first current-spreading layer 135.

In various embodiments, an oxide layer 170 is optionally deposited on the VCSEL emission structure 120. For example, an oxide layer 170 may be deposited on and/or about the VCSEL emission structure 120 to enclose the VCSEL emission structure 120 and to protect the VCSEL emission structure 120.

In various embodiments, the second contact 180, piezoelectric electrode 192, and/or the like may be deposited and/or formed onto the VCSEL emission structure 120 and/or partial disc of piezoelectric material 190. For example, various metal deposition techniques may be used to deposit the second contacts 180 and piezoelectric electrode 192. In an example embodiment, the second contacts 180 are deposited around the emission aperture 185. In an example embodiment, the second contacts 180 are deposited and/or formed such that the second contacts 180 are in direct electrical communication with the second current-spreading layer 155. In an example embodiment, the piezoelectric electrode 192 is deposited and/or formed on the second surface 193 of the piezoelectric material 190. In an example embodiment, the piezoelectric electrode 192 is deposited and/or formed on an oxide layer 170 disposed on the second surface 193 of the piezoelectric material 190. In an example embodiment, the second contact 180 is deposited and/or formed such that the second contact 180 is in electrical communication with the driving signal pad 182. In an example embodiment, the piezoelectric electrode 192 is deposited and/or formed such that the piezoelectric electrode 192 is in electrical communication with the electrode pad 194.

As should be understood, once a tunable VCSEL 100" has been formed, manufactured, and/or the like, the VCSEL may be secured, affixed, or otherwise mounted to a circuit board. For example, a VCSEL 100" may be secured, affixed, and/or mounted to a circuit board such that the driving signal pad 182 is in electrical communication with a VCSEL driver, the electrode pad 194 is in electrical communication with a deformation voltage source, and the ground pad(s) 196 are in electrical communication with an electrical ground. Mounting a tunable VCSEL 100" to a circuit board may therefore manufacture, generate, form, and/or otherwise make a board-mounted VCSEL. The board-mounted VCSEL may be a single board-mounted VCSEL or the board-mounted VCSEL may be part of a tunable VCSEL array 200 (e.g., shown in FIG. 9).

Example Tunable VCSEL Array

As shown in FIG. 9, in various embodiments, a plurality of tunable VCSELS 100, 100', 100" (e.g., 100A, 100B, 100C, 100D, 100E, 100F, 100G, 100H) may be mounted to, secured to, and/or otherwise disposed on a circuit board 210 (e.g., printed circuit board), and/or the like to provide a tunable VCSEL array 200. In various embodiments, each tunable VCSEL 100A-H of the tunable VCSEL array 200 is in electrical communication with a VCSEL driver 220. For example, the circuit board 210 may comprise leads and/or conductive lines that are configured such that, when a driving signal pad 182 of a tunable VCSEL 100 is mechanically mounted to a corresponding lead and/or conductive line of circuit board 210, a corresponding VCSEL driver 220 may provide a voltage (e.g., driving signal) to the tunable VCSEL 100. In various embodiments, the VCSEL driver 220 may be configured to drive the corresponding tunable VCSEL 100. In an example embodiment, each tunable VCSEL 100 of the tunable VCSEL array 200 is in communication with a different VCSEL driver 210. In various embodiments, each tunable VCSEL 100A-H of the tunable VCSEL array 200 is in electrical communication with a deformation voltage source 230. For example, the circuit board 210 may comprise leads and/or conductive lines that are configured such that, when an electrode pad 194 of a tunable VCSEL 100 is mechanically mounted to a corresponding lead and/or conductive line of circuit board 210, a corresponding deformation voltage source 230 may provide a voltage (e.g., a deformation voltage) to the piezoelectric electrode 192. In an example embodiment, the deformation voltage source 230 may be configured to provide a deformation voltage to the piezoelectric electrode 192 (e.g., via the electrode pad 194) that causes the piezoelectric material 190 to experience an electric field and a corresponding mechanical stress. Thus, in various embodiments, the deformation voltage source 230 is configured to control the emission wavelength $\lambda'$, bandwidth of modulation, and/or polarization of the laser light 1 emitted by the corresponding tunable VCSEL 100. In an example embodiment, the deformation voltage sources 230 of the tunable VCSEL array 200 are configured to cause each tunable VCSEL 100A-100H of the tunable VCSEL array 200 to emit laser light of a different and/or unique emission wavelength $\lambda'$. For example, the emission wavelength $\lambda_A'$ emitted by a first tunable VCSEL 100A of the tunable VCSEL array 200 is different from each of the emission wavelengths $\lambda_B'$-$\lambda_H'$ emitted by the remaining tunable VCSELs 100B-H of the tunable VCSEL array 200. As noted above, the mechanical stress experienced by the VCSEL emission structure 120 due to the mechanical stress experienced by the piezoelectric material 190 may cause the bandwidth of the tunable VCSEL 100' to be modified.

As illustrated, the tunable VCSEL array 200 comprises eight tunable VCSELs 100A-H. In various embodiments, the tunable VCSEL array comprises two, four, eight, sixteen, and/or other numbers of tunable VCSELs 100, 100', 100".

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A tunable vertical-cavity surface-emitting laser (VCSEL) comprising:
a substrate;
a VCSEL emission structure defining an emission axis;
a piezoelectric material, the piezoelectric material disposed between the substrate and the VCSEL emission structure along the emission axis;
a stiff material disposed on at least two sides of a periphery of an active cavity material structure of the VCSEL emission structure, the stiff material mechanically coupled to the piezoelectric material and to at least a portion of the periphery of the VCSEL emission structure such that the stiff material mechanically couples the piezoelectric material to the VCSEL emission structure to transform a mechanical stress experienced by the piezoelectric material into a radial mechanical stress imparted into the active cavity material structure of the VCSEL emission structure; and
a piezoelectric electrode in electrical communication with the piezoelectric material, wherein the piezoelectric electrode is configured to cause an electric field within the piezoelectric material when a voltage is applied to the piezoelectric electrode, and wherein the electric field creates the mechanical stress onto the piezoelectric material such that the piezoelectric material imparts the radial mechanical stress to the active cavity material structure and changes an emission wavelength of the VCSEL.

2. The tunable VCSEL of claim 1, wherein the stiff material is transparent to light of a nominal wavelength of the VCSEL emission structure.

3. The tunable VCSEL of claim 1, wherein the piezoelectric material is embedded in a first section of the substrate and the VCSEL emission structure is disposed on the substrate such that a first portion of the VCSEL emission structure is disposed on the first section of the substrate and a second portion of the VCSEL emission structure is disposed on a second section of the substrate, the second section of the substrate being free of the piezoelectric material.

4. The tunable VCSEL of claim 3, wherein application of the mechanical stress by the electric field onto the piezoelectric material by the piezoelectric electrode causes the active cavity material structure to experience a non-uniform mechanical stress.

5. The tunable VCSEL of claim 4, wherein the non-uniform mechanical stress causes laser light emitted by the VCSEL emission structure to have a particular polarization.

6. The tunable VCSEL of claim 1, wherein the mechanical stress causes a change in a band structure of the active cavity material structure, resulting in the emission wavelength being different from a nominal wavelength of the VCSEL emission structure.

7. The tunable VCSEL of claim 1, wherein the stiff material has a Young's modulus of at least 65 GPa.

8. The tunable VCSEL of claim 1, wherein the substrate comprises at least a portion of a circuit board.

9. The tunable VCSEL of claim 1, wherein the substrate comprises a gallium arsenide substrate.

10. The tunable VCSEL of claim 1, wherein the substrate comprises a silicon substrate.

11. The tunable VCSEL of claim 1, wherein the VCSEL emission structure comprises a first reflector and a second reflector, and wherein the active cavity material structure is disposed between the first reflector and the second reflector.

12. A method for manufacturing a tunable VCSEL, the method comprising:
providing a substrate, wherein a piezoelectric material is at least partially embedded within at least a first section of the substrate;
forming a VCSEL emission structure on the first section and a second section of the substrate, the VCSEL emission structure defining an emission axis, the piezoelectric material disposed between the substrate and the VCSEL emission structure in a direction parallel to the emission axis in the first section of the substrate;
depositing a piezoelectric electrode on a surface of the piezoelectric material; and
depositing a stiff material about a periphery of an active cavity material structure of the VCSEL emission structure such that the stiff material is disposed on at least two sides of the VCSEL emission structure, the stiff material mechanically coupled to the piezoelectric material and to the periphery of the active cavity material structure of the VCSEL emission structure such that the piezoelectric material is mechanically coupled to the VCSEL emission structure by the stiff material around the periphery of the active cavity material structure of the VCSEL emission structure, such that when the piezoelectric material experiences a mechanical stress, the mechanical stress is transferred as a radial mechanical stress imparted into the active cavity material structure of the VCSEL emission structure.

13. The method of claim 12, wherein the stiff material is transparent to light of a nominal wavelength of the VCSEL emission structure.

14. The method of claim 13, wherein the stiff material has a Young's modulus of at least 65 GPa.

15. The method of claim 12, wherein the piezoelectric material is embedded in only the first section of the substrate such that the VCSEL structure is disposed on both the first section and the second section of the substrate with the first section of the substrate comprising the piezoelectric material and the second section of the substrate being free of the piezoelectric material.

16. The method of claim 12, wherein the piezoelectric material is embedded in both the first section and the second section of the substrate.

17. The method of claim 12, wherein the substrate comprises at least a portion of a circuit board.

18. The method of claim 12, wherein the substrate comprises a gallium arsenide substrate.

19. The method of claim 12, wherein the substrate comprises a silicon substrate.

20. The method of claim 12, wherein the VCSEL emission structure comprises a first reflector and a second reflector, and wherein the active cavity material structure is disposed between the first reflector and the second reflector.

* * * * *